(12) United States Patent
Wang

(10) Patent No.: US 12,307,948 B2
(45) Date of Patent: May 20, 2025

(54) DISPLAY SUBSTRATE, METHOD OF MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Miao Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/027,308

(22) PCT Filed: Jun. 30, 2022

(86) PCT No.: PCT/CN2022/102741
§ 371 (c)(1),
(2) Date: Mar. 20, 2023

(87) PCT Pub. No.: WO2024/000376
PCT Pub. Date: Jan. 4, 2024

(65) Prior Publication Data
US 2024/0355265 A1 Oct. 24, 2024

(51) Int. Cl.
*G09G 3/32* (2016.01)
*H10D 86/01* (2025.01)
(Continued)

(52) U.S. Cl.
CPC ............. *G09G 3/32* (2013.01); *H10D 86/021* (2025.01); *H10D 86/441* (2025.01);
(Continued)

(58) Field of Classification Search
CPC ............. G09G 3/32; G09G 2300/0408; G09G 2300/0426; G09G 2300/0819;
(Continued)

(56) References Cited

U.S. PATENT DOCUMENTS

2012/0139881 A1    6/2012    Kwon et al.
2017/0301293 A1    10/2017    Zhu et al.
(Continued)

FOREIGN PATENT DOCUMENTS

CN    106558287 A    4/2017
CN    111583866 A    8/2020
(Continued)

*Primary Examiner* — Kenneth Bukowski
(74) *Attorney, Agent, or Firm* — BROOKS KUSHMAN P.C.

(57) ABSTRACT

A display substrate, a method of manufacturing the same and a display substrate. The display substrate includes a plurality of first gate driving circuits and a plurality of second gate driving circuits, a first gate driving signal output by the first gate driving circuit and a second gate driving signal output by the second gate driving circuit have different timing; the first gate driving circuit and the second gate driving circuit share at least one signal line.

16 Claims, 15 Drawing Sheets

(51) Int. Cl.
  *H10D 86/40* (2025.01)
  *H10D 86/60* (2025.01)
(52) U.S. Cl.
  CPC ..... *H10D 86/60* (2025.01); *G09G 2300/0408* (2013.01); *G09G 2300/0426* (2013.01); *G09G 2300/0819* (2013.01); *G09G 2300/0842* (2013.01); *G09G 2310/0267* (2013.01); *G09G 2310/08* (2013.01); *G09G 2320/0247* (2013.01)
(58) Field of Classification Search
  CPC ... G09G 2300/0842; G09G 2310/0267; G09G 2310/08; G09G 2320/0247; H01L 27/124; H01L 27/1259
  See application file for complete search history.

(56) References Cited

U.S. PATENT DOCUMENTS

| | | | |
|---|---|---|---|
| 2020/0090613 A1* | 3/2020 | Du | G11C 19/28 |
| 2020/0388229 A1 | 12/2020 | Zhang et al. | |
| 2021/0201770 A1 | 7/2021 | Park et al. | |
| 2021/0407351 A1 | 12/2021 | Huang et al. | |
| 2022/0301497 A1* | 9/2022 | Zhang | G09G 3/3266 |
| 2023/0133301 A1* | 5/2023 | Chen | H01L 27/1218 345/211 |
| 2023/0154429 A1* | 5/2023 | Pan | G09G 3/3266 345/87 |

FOREIGN PATENT DOCUMENTS

| | | |
|---|---|---|
| CN | 111710281 A | 9/2020 |
| CN | 111986607 A | 11/2020 |
| CN | 112449712 A | 3/2021 |
| CN | 112669772 A | 4/2021 |
| CN | 113299223 A | 8/2021 |
| CN | 113471225 A | 10/2021 |
| CN | 113948038 A | 1/2022 |
| CN | 114299848 A | 4/2022 |
| WO | 2022036742 A | 2/2022 |

* cited by examiner

DISPLAY SUBSTRATE, METHOD OF MANUFACTURING THE SAME AND DISPLAY DEVICE

CROSS-REFERENCE TO RELATED APPLICATION

This application is the U.S. National Phase of PCT Application No. PCT/CN2022/102741 filed on Jul. 30, 2022, which is incorporated herein by reference in its entirety.

TECHNICAL FIELD

The present disclosure relates to the field of display technology, in particular to a display substrate, a method of manufacturing the same and a display device.

BACKGROUND

With the rapid development of intelligence, the market demand and expectation for intelligent terminal display devices is increasing. Intelligent terminal display devices such as cellphones and tablets are increasingly needed in people's lives, and more diverse application scenarios are driving people to pursue comprehensive screen displays, as well as larger sizes and higher resolution visual experiences. In response to the demand for optimized display effects, low frequency displays have become a focus for reducing power consumption

SUMMARY

The present disclosure aims to provide a display substrate, a method of manufacturing the same and a display device.

In one aspect, the present disclosure provides in some embodiments a display substrate, including a plurality of first gate driving circuits and a plurality of second gate driving circuits, wherein a first gate driving signal output by the first gate driving circuit and a second gate driving signal output by the second gate driving circuit have different timing; the first gate driving circuit and the second gate driving circuit share at least one signal line.

Optionally, the display substrate comprises a display area and a peripheral area surrounding the display area; the plurality of first gate driving circuits and the plurality of second gate driving circuits are all arranged in the peripheral area; at least part of the first gate driving circuits and at least part of the second gate driving circuits are symmetrically arranged in a peripheral area close to a same side of the display area.

Optionally, the first gate driving circuit and the second gate driving circuit share a first level signal line, and the first level signal line transmits a DC signal having a first level.

Optionally, at least part of an orthographic projection of the first level signal line on a base substrate of the display substrate is located between an orthographic projection of the first gate driving circuit on the base substrate and an orthographic projection of the second gate driving circuit on the base substrate.

Optionally, the orthographic projection of the first level signal line on the base substrate at least partially overlaps the orthographic projection of the first gate driving circuit on the base substrate; and/or, the orthographic projection of the first level signal line on the base substrate at least partially overlaps the orthographic projection of the second gate driving circuit on the base substrate.

Optionally, the first gate driving circuit and the second gate driving circuit share a first clock signal line and/or a second clock signal line, a phase of a first clock signal transmitted by the first clock signal line is opposite to a phase of a second clock signal transmitted by the second clock signal line.

Optionally, at least part of the first gate driving circuits and at least part of the second gate driving circuits are arranged symmetrically with respect to a first symmetry axis; the first symmetry axis at least partially overlaps the first clock signal line, or the first symmetry axis at least partially overlaps the second clock signal line, or the first symmetry axis at least partially overlaps the first level signal line.

Optionally, the orthographic projection of the first level signal line on the base substrate is located between an orthographic projection of the first clock signal line on the base substrate and an orthographic projection of the second clock signal line on the base substrate.

Optionally, the orthographic projection of the first clock signal line on the base substrate at least partially overlaps an orthographic projection of one of the first gate driving circuit and the second gate driving circuit on the base substrate; the orthographic projection of the second clock signal line on the base substrate at least partially overlaps an orthographic projection of the other of the first gate driving circuit and the second gate driving circuit on the base substrate.

Optionally, the first gate driving circuit is coupled to a first frame start signal line, and the second gate driving circuit is coupled to a second frame start signal line.

Optionally, the orthographic projection of the first level signal line on the base substrate is located between an orthographic projection of the first frame start signal line on the base substrate and an orthographic projection of the second frame start signal line on the base substrate.

Optionally, the orthographic projection of the first frame start signal line on the base substrate at least partially overlaps the orthographic projection of the first gate driving circuit on the base substrate; the orthographic projection of the second frame start signal line on the base substrate at least partially overlaps the orthographic projection of the second gate driving circuit on the base substrate.

Optionally, the orthographic projection of the first frame start signal line on the base substrate and the orthographic projection of the second frame start signal line on the base substrate are located between the orthographic projection of the first clock signal line on the base substrate and the orthographic projection of the second clock signal line on the base substrate.

Optionally, at least one of the first level signal line, the first clock signal line, the second clock signal line, and the first frame start signal line and the second frame start signal line is made using a second source-drain metal layer in the display substrate.

Optionally, at least one of the first level signal line, the first clock signal line, the second clock signal line, the first frame start signal line and the second frame start signal line includes two layers of conductive layers stacked to each other, one layer of conductive layer is made of the second source-drain metal layer, and the other layer of conductive layer is made of a third source-drain metal layer in the display substrate.

Optionally, a width-to-length ratio of a channel of an output transistor included in the first gate driving circuit is equal to a width-to-length ratio of a channel of an output transistor included in the second gate driving circuit.

Optionally, a width-to-length ratio of a channel of an output transistor included in the first gate driving circuit is greater than a width-to-length ratio of a channel of an output transistor included in the second gate driving circuit.

Optionally, at least part of target devices having a same function in the first gate driving circuits and the second gate driving circuits are coupled to each other.

Optionally, the display substrate further includes a plurality of first sub-pixel driving circuits, a plurality of light emitting elements, a plurality of data lines, a plurality of second initialization signal lines and a plurality of third initialization signal lines, the first sub-pixel driving circuit includes a first driving transistor, a first data writing-in transistor, a first compensation transistor, a second reset transistor and a third reset transistor; a gate electrode of the first data writing-in transistor is coupled to an output terminal of a corresponding first gate driving circuit, and a first electrode of the first data writing-in transistor is coupled to a corresponding data line, and a second electrode of the first data writing-in transistor is coupled to a first electrode of the first driving transistor; a gate electrode of the first compensation transistor is coupled to the output terminal of the corresponding first gate driving circuit, and a first electrode of the first compensation transistor is coupled to a second electrode of the first driving transistor, a second electrode of the first compensation transistor is coupled to a gate electrode of the first driving transistor; a gate electrode of the second reset transistor is coupled to an output terminal of a corresponding second gate driving circuit, and a first electrode of the second reset transistor is coupled to a corresponding second initialization signal line, and a second electrode of the second reset transistor is coupled to a corresponding light emitting element; a gate electrode of the third reset transistor is coupled to the output terminal of the corresponding second gate driving circuit, and a first electrode of the third reset transistor is coupled to a corresponding third initialization signal line, and a second electrode of the third reset transistor is coupled to the first electrode of the first driving transistor.

Optionally, the display substrate further includes a plurality of second sub-pixel driving circuits, a plurality of light emitting elements, a plurality of data lines and a plurality of second initialization signal lines, the second sub-pixel driving circuit includes a second driving transistor, a second data writing-in transistor, a second compensation transistor and a second reset transistor; a gate electrode of the second data writing-in transistor is coupled to an output terminal of a corresponding second gate driving circuit, and a first electrode of the second data writing-in transistor is coupled to a corresponding data line, and a second electrode of the second data writing-in transistor is coupled to a first electrode of the second driving transistor; a gate electrode of the second compensation transistor is coupled to an output terminal of a corresponding first gate driving circuit, and a first electrode of the second compensation transistor is connected to a second electrode of the second driving transistor, a second electrode of the second compensation transistor is coupled to a gate electrode of the second driving transistor; a gate electrode of the second reset transistor is coupled to the output terminal of the corresponding second gate driving circuit, and a first electrode of the second reset transistor is coupled to a corresponding second initialization signal line, and a second electrode of the second reset transistor is coupled to a corresponding light emitting element.

Optionally, the display substrate further comprises: a first electrostatic discharge circuit, the first electrostatic discharge circuit being coupled to the first gate driving circuit; a second electrostatic discharge circuit, the second electrostatic discharge circuit being coupled to the second gate driving circuit; wherein the first electrostatic discharge circuit and the second electrostatic discharge circuit are arranged symmetrically, and the first electrostatic discharge circuit and the second electrostatic discharge circuit share at least one signal line.

Optionally, the peripheral area further comprises: a plurality of light emitting control driving circuits, wherein the plurality of light emitting control driving circuits are divided into a plurality of groups of light emitting control driving circuits, each group of light emitting control driving circuits include two light emitting control driving circuit that are arranged symmetrically, the two light emitting control driving circuits share at least one signal line.

In a second aspect, a display device includes the display substrate.

In a third aspect, a method of manufacturing the display substrate includes: making the plurality of first gate driving circuits and the plurality of second gate driving circuits, the first gate driving signal output by the first gate driving circuit and the second gate driving signal output by the second gate driving circuit have different timing; the first gate driving circuit and the second gate driving circuit share at least one signal line.

BRIEF DESCRIPTION OF THE DRAWINGS

The accompanying drawings are provided to further illustrate embodiments of the present disclosure and constitute a part of the present disclosure. The embodiments and their description are used to explain the present disclosure and do not limit the present disclosure in an improper way.

DETAILED DESCRIPTION

To further illustrate embodiments of the present disclosure providing a display substrate, a method of manufacturing the same, and a display device, the detailed description will be given below in conjunction with the accompanying drawings.

Figure 1:
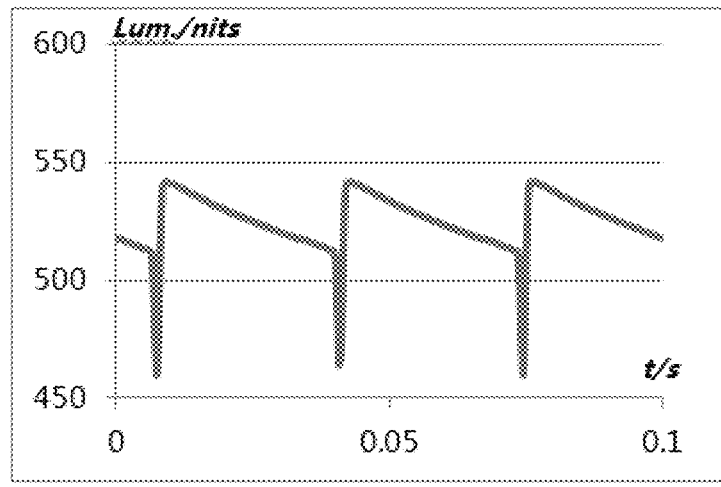
FIG. 1 is a schematic diagram showing the brightness of a display substrate changing over time according to an embodiment of the present disclosure.
Figure 2:
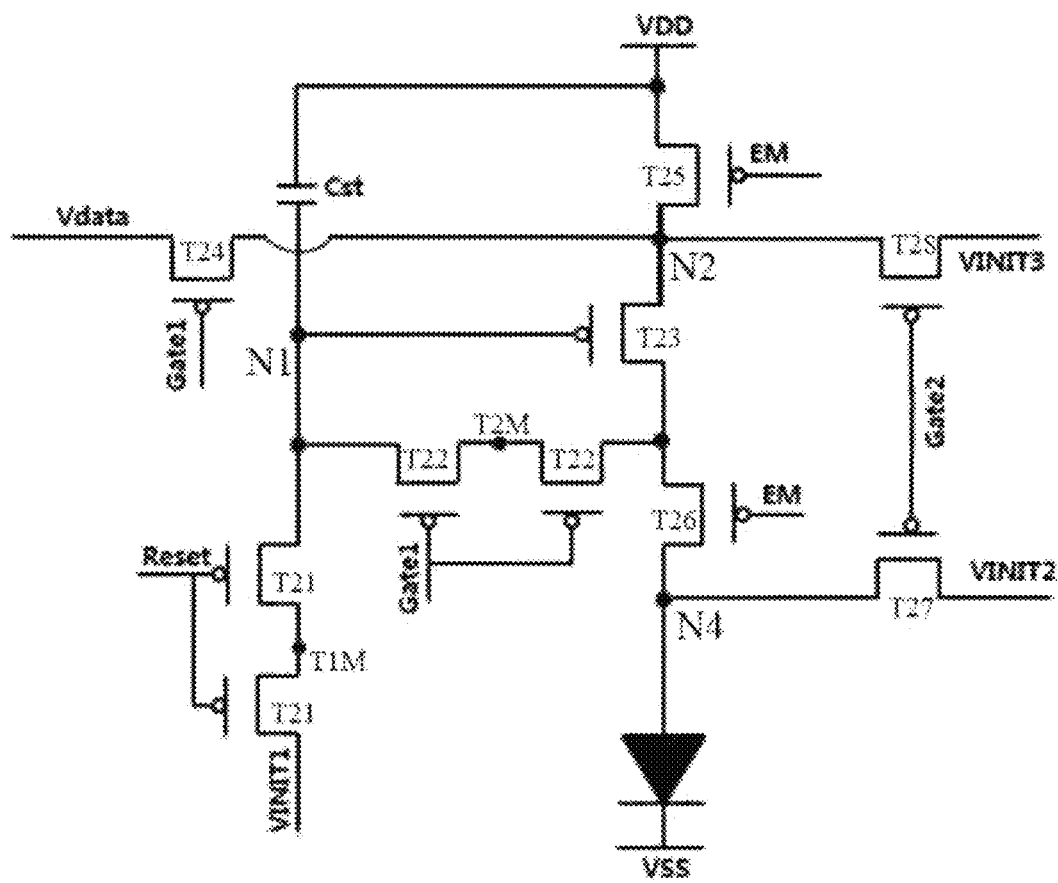
FIG. 2 is a schematic diagram showing the circuit structure of an 8T1C according to an embodiment of the present disclosure.
Figure 3:
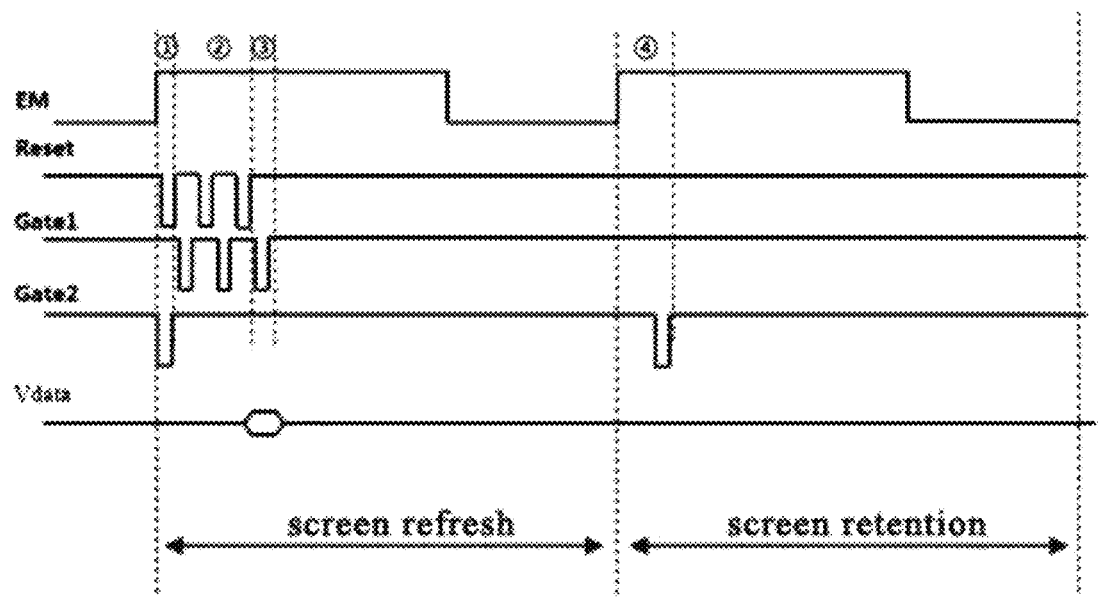
FIG. 3 is a timing diagram showing the operation of a display substrate during screen refresh and screen retention according to an embodiment of the present disclosure.

Referring to Table 1, FIG. 2, and FIG. 3, due to the voltage of T2M node and TIM node around the N1 node in the sub-pixel driving circuit causing leakage current to affect the N1 node, the voltage of N1 node will be continuously written to a high level during one frame (such as $\Delta N1=0.0713V$), which cannot be stabilized and results in a decrease in brightness (such as the potential change of $\Delta N4=0.064V$ on the N4 node), as shown in FIG. 1. The human eye can clearly observe the change in brightness and the flickering of the image improving the problem of low-frequency flickering, it will be driven by adding a group of gate driving circuits.

As shown in FIG. 2 and FIG. 3, in low-frequency display, the longV mode is used for driving display, that is, there are a plurality of pulse inputs within one frame of the light emitting control signal EM. The first pulse of the light emitting control signal EM is a screen refresh frame, which realizes the writing of the data signal; the second pulse and the third pulse of the light emitting control signal EM are screen retention frames, and the anode of the light emitting element is reset within the screen retentions frames.

In more detail, the sub-pixel driving circuit includes an 8T1C (that is, 8 transistors and 1 capacitor) circuit structure as an example.

In the screen refresh frame, there are three voltage writing-in phases. Phase ① is the reset signal (transmitted by the reset signal line Reset) and the second gate driving signal (transmitted by the second scanning line Gate2) are turned on at a low level, N1 node is reset to the first initialization signal (transmitted by the first initialization signal line VINIT1), and the N2 node is reset to the third initialization signal (transmitted by the third initialization signal line VINIT3); the phase ② is the repeat reset phase of the N1 node; phase ③ is the first gate driving signal (transmitted by the first scanning line Gate1) that is turned on at a low level, and a data signal (transmitted by the data line Vdata) is written into the N1 node; then the light emitting control signal EM is at a low level, and the pixel emits light.

In the screen retention frame, there is a phase ④, in which the light emitting control signal EM is turned off at a high level, and the second gate driving signal is turned on at a low level, at this time, the anode of the light emitting element is reset to the second initialization signal (transmitted by the second initialization signal line VINIT2), and the N2 node is reset to the third initialization signal (for example: the voltage value of the third initialization signal is 2V); then the light emitting control signal EM is turned on at a low level, and the pixel emits light.

In the display substrate provided by the present disclosure, a first gate driving circuit, a second gate driving circuit and a light emitting control driving circuit are provided. The light emitting control driving circuit drives the multi-pulse light emitting control signal EM output in one frame to control whether to emit light or not; the second gate driving circuit drives the multi-pulse second gate driving signal output in one frame to control the reset of the anode and the reset of N2 node. The first gate driving circuit drives 3pulse first gate driving signal output within one frame, which is used to control the writing of data signals and the reset of the N1 node.

Since the display substrate provided in the present disclosure includes a plurality of groups of gate driving circuits, how to meet the requirement of a narrow frame of the display substrate becomes an important point.

TABLE 1

| EM | Refresh frame (EM first pulse) | Retention frame (EM second pulse) | Refresh frame (EM third pulse) | Retention frame (EM fourth pulse) | Refresh frame (EM fifth pulse) | Retention frame (EM sixth pulse) |
|---|---|---|---|---|---|---|
| Avg. N1 | 1.149 | 1.189 | 1.207 | 1.215 | 1.219 | 1.220 |
| Avg. N4 | 0.050 | 0.013 | −0.003 | −0.009 | −0.013 | −0.014 |

Since the flickering of the screen is mainly caused by the voltage change of the N1 node within one frame, when Referring to FIG. 4, FIG. 6, FIG. 7 and FIG. 12, an embodiment of the present disclosure provides a display substrate, including: a plurality of first gate driving circuits Gate1-GOA and a plurality of second gate driving circuits Gate2-GOA, the first gate driving signal GOUT1 output by the first gate driving circuit Gate1-GOA and the second gate driving signal GOUT2 output by the second gate driving circuit Gate2-GOA have different timings; the first gate driving circuit Gate1-GOA and the second gate driving circuit Gate2-GOA share at least one signal line.

Exemplarily, the first gate driving circuit Gate1-GOA and the second gate driving circuit Gate2-GOA are connected to the same sub-pixel driving circuit.

Exemplarily, the first gate driving circuit Gate1-GOA and the second gate driving circuit Gate2-GOA are connected to the same row of sub-pixel driving circuits; or, the first gate driving circuit Gate1-GOA and the second gate driving circuit Gate2-GOA are connected to the sub-pixel driving circuits of the same color.

Exemplarily, the first gate driving circuit Gate1-GOA includes a plurality of transistors and storage capacitors, and the first gate driving circuit Gate1-GOA is respectively connected to the first level signal line VGH, the second level signal line VGL, the first clock signal line GCK, the second clock signal line GCB and the first frame start signal line GSTV1, and the plurality of transistors and storage capacitors included in the first gate driving circuit Gate1-GOA output the first gate driving signal GOUT1 under the common control of the corresponding signals provided by the signal lines.

Exemplarily, the second gate driving circuit Gate2-GOA includes a plurality of transistors and storage capacitors, and the second gate driving circuit Gate2-GOA is respectively connected to the first level signal line VGH and the second level signal line VGL, the first clock signal line GCK, the second clock signal line GCB and the second frame start signal line GSTV2, and the plurality of transistors and storage capacitors included in the second gate driving circuit Gate2-GOA output the second gate driving signal GOUT2 under the common control of the corresponding signals provided by the signal lines.

In more detail, as shown in FIG. 8 to FIG. 12, the circuit structures of the first gate driving circuit Gate1-GOA and the second gate driving circuit Gate2-GOA are substantially the same.

The first gate driving circuit Gate1-GOA and the second gate driving circuit Gate2-GOA include a first transistor T1 to an eighth transistor T8, a first capacitor C1 and a second capacitor C2.

The gate electrode of the first transistor T1 is coupled to the first clock signal line GCK, the first electrode of the first transistor T1 is coupled to the first frame start signal line GSTV1, and the second electrode of the first transistor T1 is coupled to the gate electrode of the second transistor T2.

A first electrode of the second transistor T2 is coupled to the first clock signal line GCK, and a second electrode of the second transistor T2 is coupled to a second electrode of the third transistor T3.

The gate electrode of the third transistor T3 is coupled to the first clock signal line GCK, and the first electrode of the third transistor T3 is coupled to the second level signal line VGL.

The gate electrode of the fourth transistor T4 is coupled to the second electrode of the third transistor T3, and the second electrode of the fourth transistor T4 is used as the output terminal of the gate driving circuit to output the first gate driving signal GOUT1 at the output terminal of the first gate driving circuit Gate1-GOA, and output the second gate driving signal GOUT2 at the output terminal of the second gate driving circuit Gate2-GOA.

The first electrode plate C21 of the second capacitor C2 is coupled to the gate electrode of the fourth transistor T4, and the second electrode plate C22 of the second capacitor C2 is coupled to the first electrode of the fourth transistor T4.

The gate electrode of the fifth transistor T5 is coupled to the second electrode of the eighth transistor T8, the first electrode of the fifth transistor T5 is coupled to the second clock signal line GCB, the second electrode of the fifth transistor T5 is coupled to the second electrode of the fourth transistor T4.

The first electrode plate C11 of the first capacitor C1 is coupled to the gate electrode of the fifth transistor T5, and the second electrode plate C12 of the first capacitor C1 is coupled to the second electrode of the fifth transistor T5.

The gate electrode of the sixth transistor T6 is coupled to the gate electrode of the fourth transistor T4, the first electrode of the sixth transistor T6 is coupled to the first level signal line VGH, the second electrode of the sixth transistor T6 is coupled to the first electrode of the seventh transistor T7.

The gate electrode of the seventh transistor T7 is coupled to the second clock signal line GCB, and the second electrode of the seventh transistor T7 is coupled to the second electrode of the first transistor T1.

The gate electrode of the eighth transistor T8 is coupled to the second level signal line VGL, and the first electrode of the eighth transistor T8 is coupled to the second electrode of the seventh transistor T7.

Exemplarily, the first level signal transmitted by the first level signal line VGH coupled to the first gate driving circuit Gate1-GOA, and the first level signal transmitted by the first level signal line VGH coupled to the second gate driving circuit Gate2-GOA are the same. The second level signal transmitted by the second level signal line VGL coupled to the first gate driving circuit Gate1-GOA, and the second level signal transmitted by the second level signal line VGL coupled to the second gate driving circuit Gate2-GOA are the same. The first clock signal transmitted by the first clock signal line GCK coupled to the first gate driving circuit Gate1-GOA, and the first clock signal transmitted by the first clock signal line GCK coupled to the second gate driving circuit Gate2-GOA are the same. The second clock signal transmitted by the second clock signal line GCB coupled to the first gate driving circuit Gate1-GOA, and the second clock signal transmitted by the second clock signal line GCB coupled to the second gate driving circuit Gate2-GOA are the same.

It is worth noting that because the first gate driving circuit Gate1-GOA and the second gate driving circuit Gate2-GOA are both a row of gate driving circuits driving a row of pixels, that is, a one-to-one driving design, therefore, the first clock signal connected to the first gate driving circuit Gate1-GOA and the first clock signal connected to the second gate driving circuit Gate2-GOA have the same pulse width and frequency, and the second clock signal connected to the first gate driving circuit Gate1-GOA and the second clock signal connected to the second gate driving circuit Gate2-GOA have the same pulse width and frequency.

Exemplarily, the first gate driving circuit Gate1-GOA and the second gate driving circuit Gate2-GOA share the first level signal line VGH, the second level signal line VGL, and at least one of the first clock signal line GCK and the second clock signal line GCB.

Exemplarily, the line width of the signal lines shared by the first gate driving circuit Gate1-GOA and the second gate driving circuit Gate2-GOA is greater than the line width of the signal lines not shared, but it is not limited thereto.

Optionally, both the line width of the first clock signal line GCK and the line width of the second clock signal line GCB are greater than the line width of the first level signal line VGH, and each of them is greater than the line width of the second level signal line VGL.

Optionally, the line width of the first level signal line VGH is greater than the line width of the first clock signal line GCK and the second clock signal line GCB, and greater than the line width of the second level signal line VGL.

According to the specific structure of the above-mentioned display substrate, in the display substrate provided by the embodiments of the present disclosure, the display substrate includes a plurality of first gate driving circuits Gate1-GOA and a plurality of second gate driving circuits Gate2-GOA, which solved the low-frequency flicker problem of the display substrate. Moreover, the first gate driving circuit Gate1-GOA and the second gate driving circuit Gate2-GOA share at least one signal line, the width of the frame jointly occupied by the first gate driving circuit Gate1-GOA, the second gate driving circuit Gate1-GOA and the signal line connected to them is decreased, which not only facilitates the narrow frame of the display substrate, but also effectively reduces the power consumption of the gate driving circuit.

As shown in FIG. 7 to FIG. 12, in some embodiments, the display substrate includes a display area and a peripheral area surrounding the display area; the plurality of first gate driving circuits Gate1-GOA and the plurality of second gate driving circuits Gate2-GOA are all located in the peripheral area;

In a peripheral area close to the same side of the display area, at least part of the first gate driving circuits Gate1-GOA and at least part of the second gate driving circuits Gate2-GOA are arranged symmetrically.

Exemplarily, the first gate driving circuit Gate1-GOA and the second gate driving circuit Gate2-GOA may be distributed on the left frame and/or the right frame of the display substrate.

Figure 9:
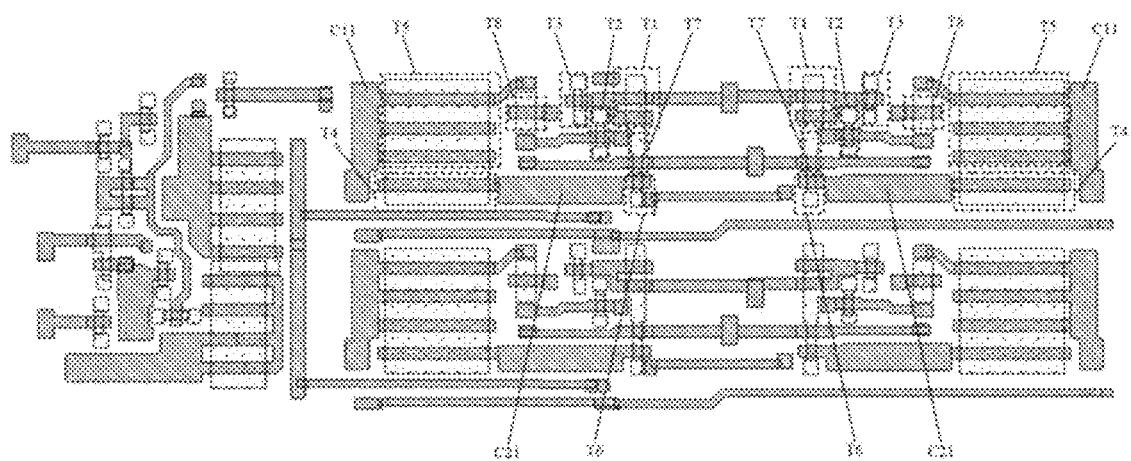
FIG. 9 is a schematic diagram illustrating a layout of an active layer and a first gate metal layer in FIG. 7.
Figure 10:
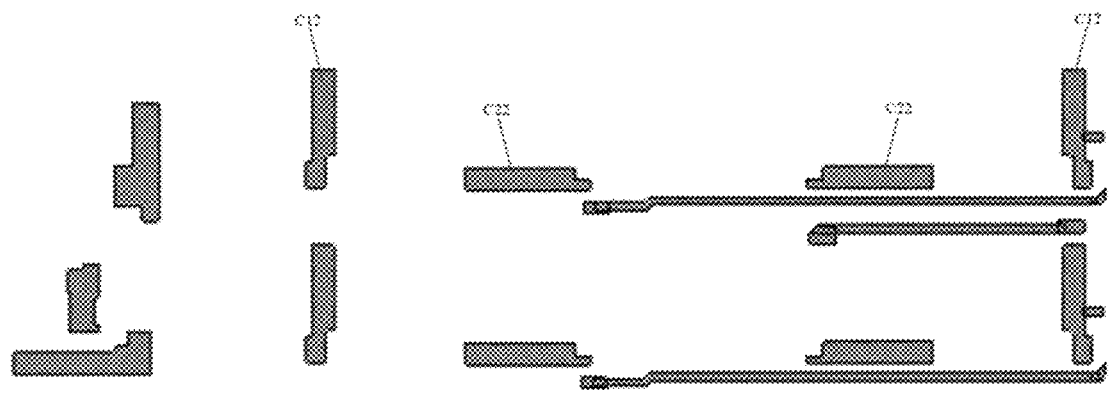
FIG. 10 is a schematic diagram illustrating a layout of a second gate metal layer in FIG. 7.
Figure 11:
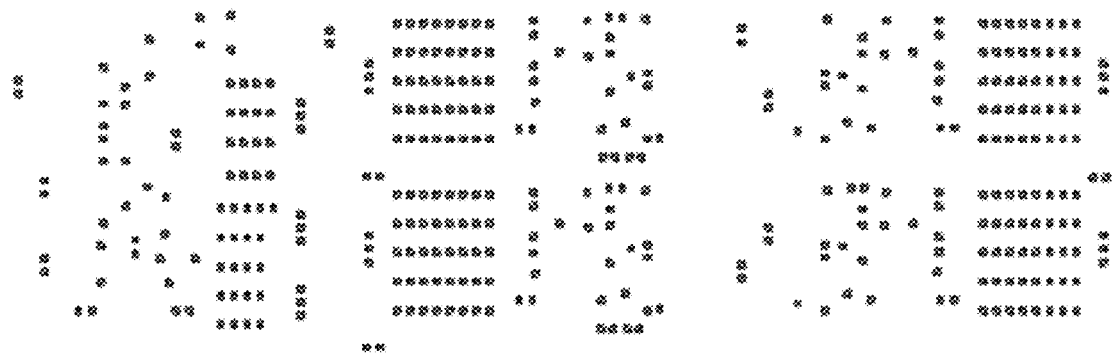
FIG. 11 is a schematic diagram illustrating a via hole formed on an interlayer insulating layer in FIG. 7.
Figure 12:
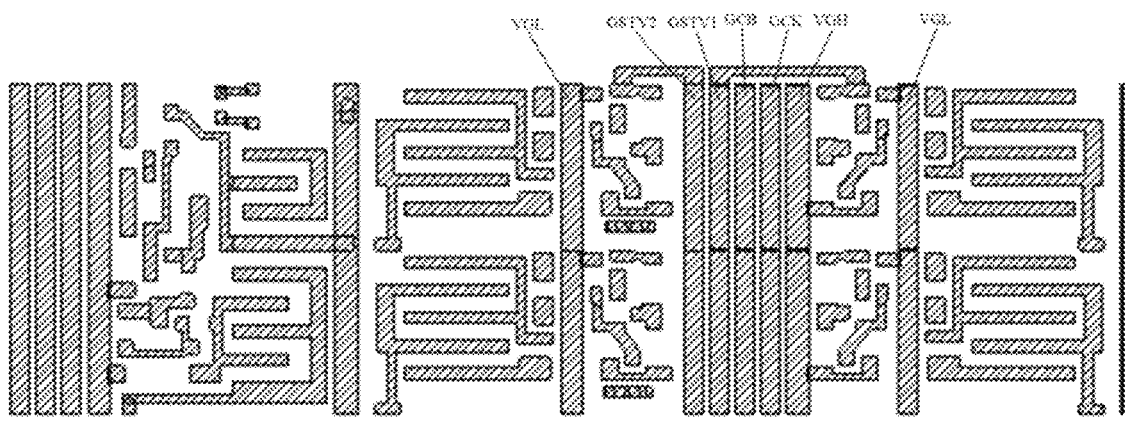
FIG. 12 is a schematic diagram illustrating a layout of a first source-drain metal layer in FIG. 7.
Figure 13:
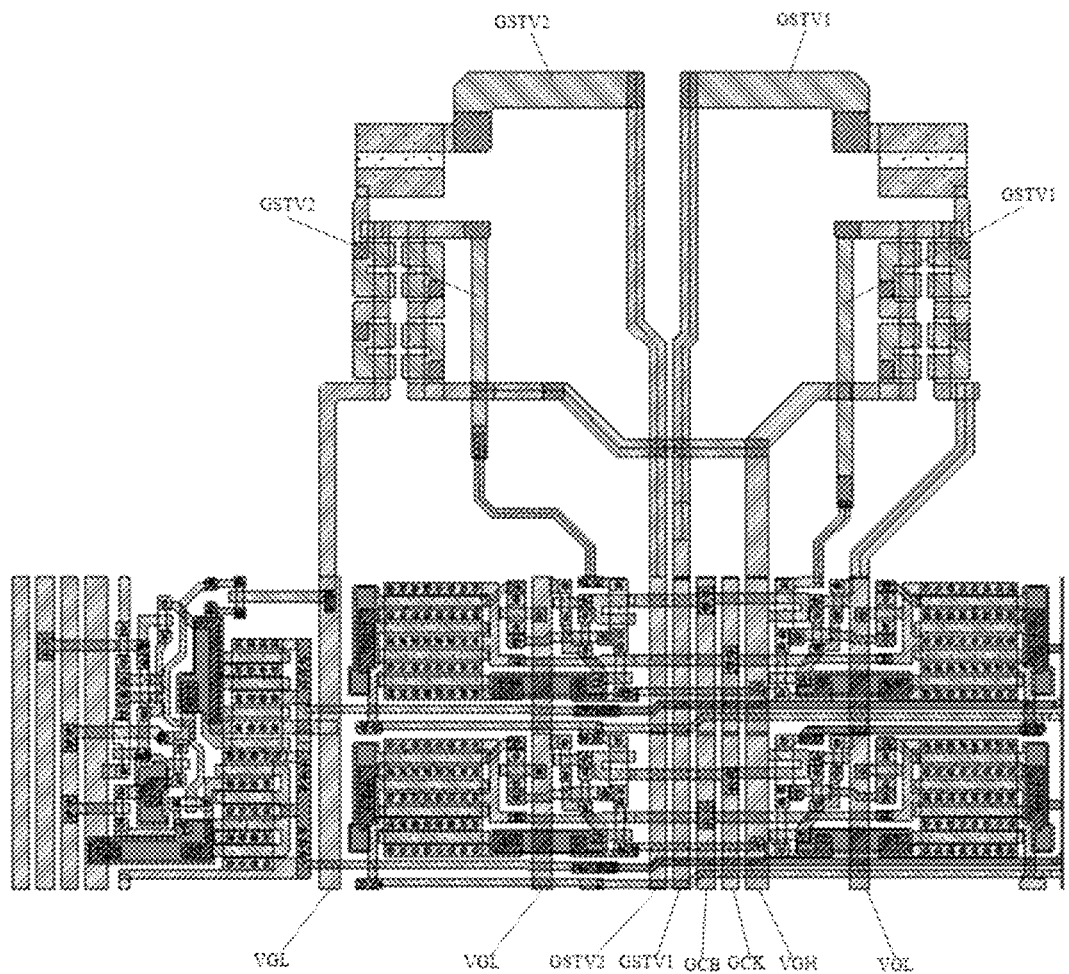
FIG. 13 is a schematic diagram illustrating a layout of a gate driving circuit and an electrostatic discharge circuit according to an embodiment of the present disclosure.
Figure 14:
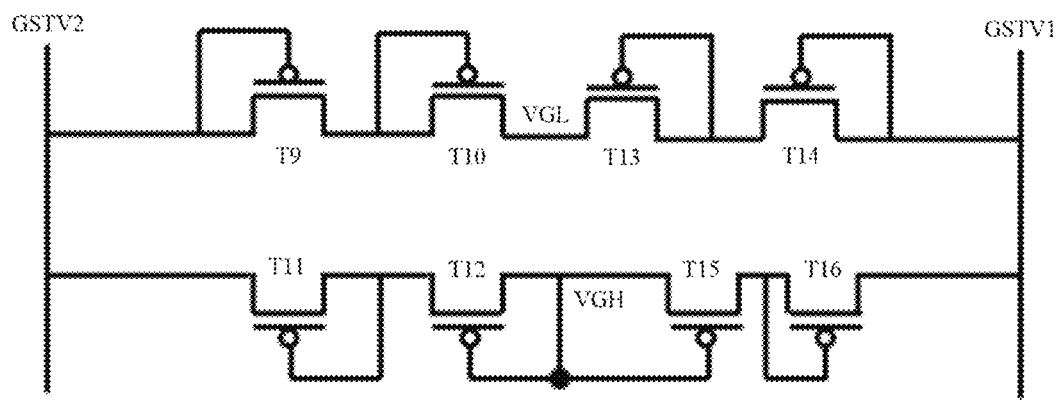
FIG. 14 is a schematic diagram illustrating a circuit structure of an electrostatic discharge circuit according to an embodiment of the present disclosure.
Figure 15:
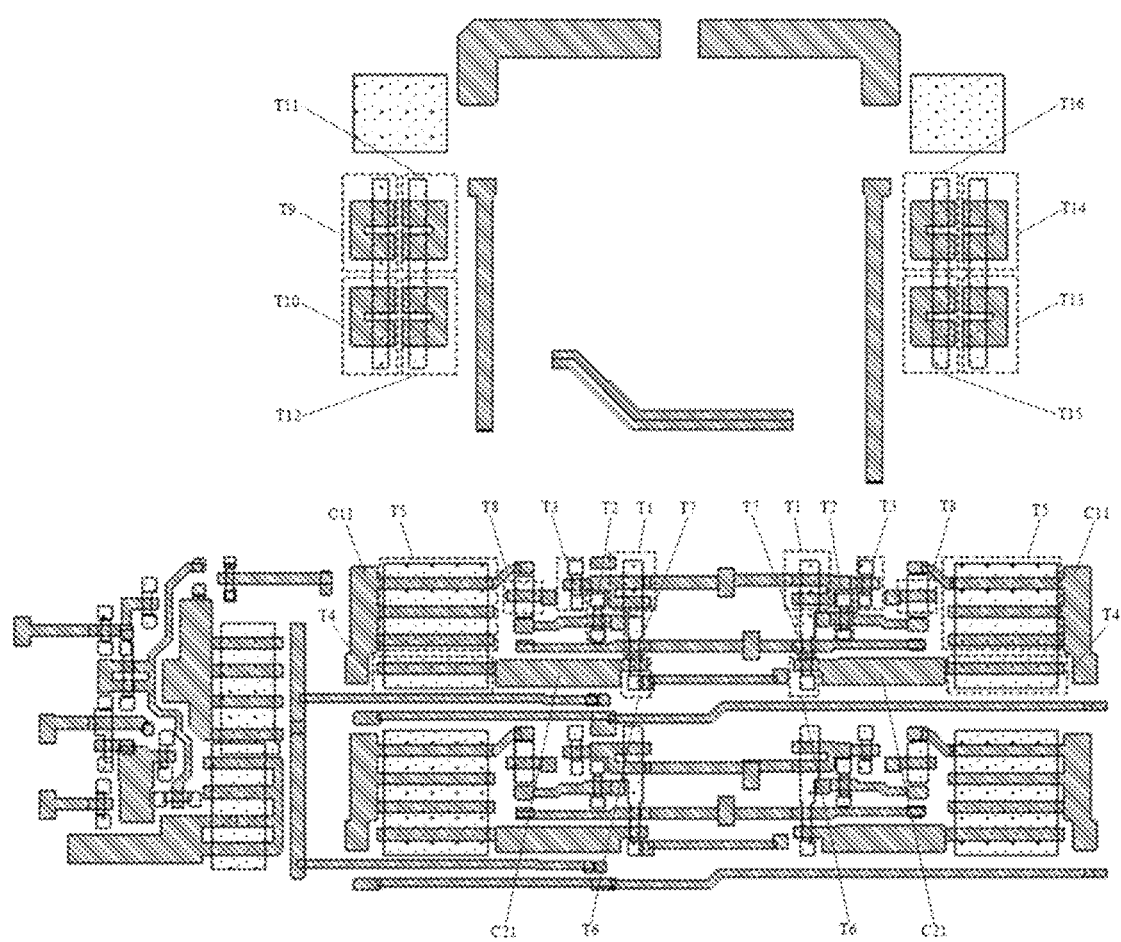
FIG. 15 is a schematic diagram illustrating a layout of an active layer and a first gate metal layer in FIG. 13.
Figure 16:
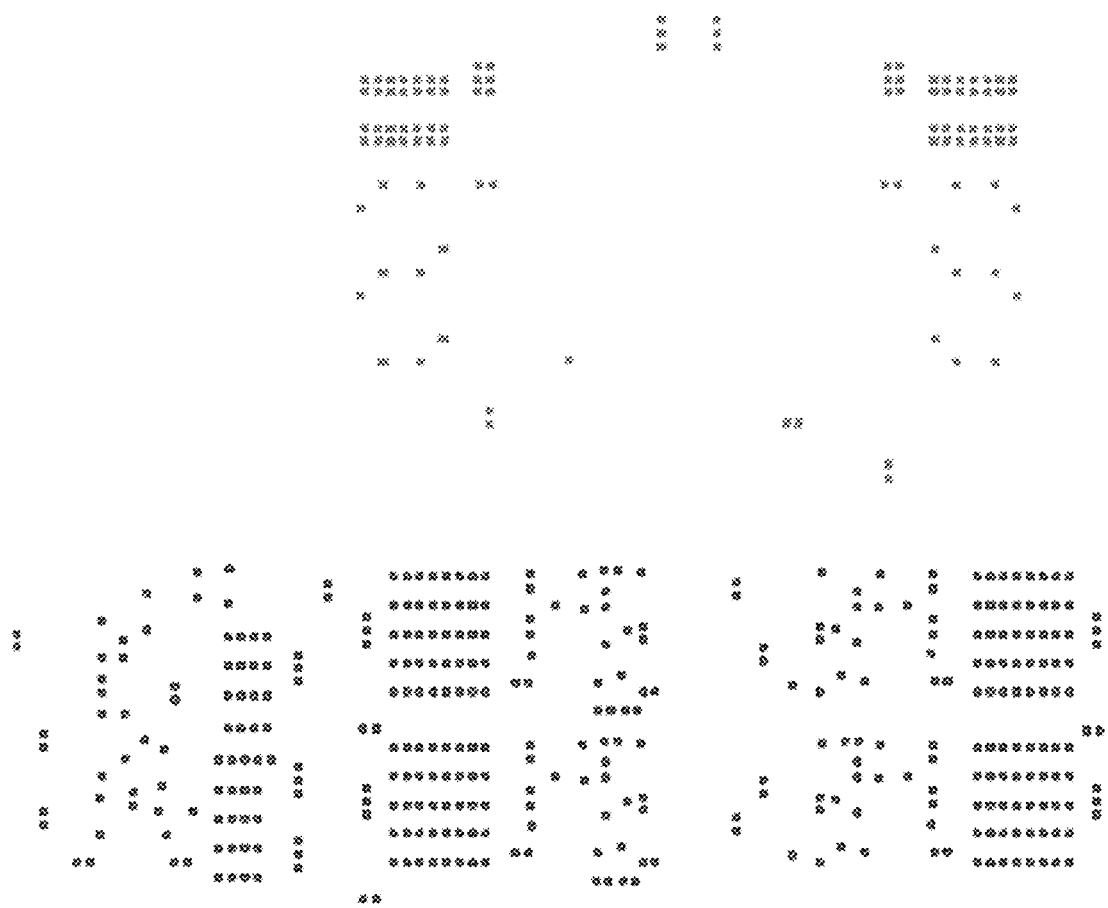
FIG. 16 is a schematic diagram illustrating a via hole formed on an interlayer insulating layer in FIG. 13.
Figure 17:
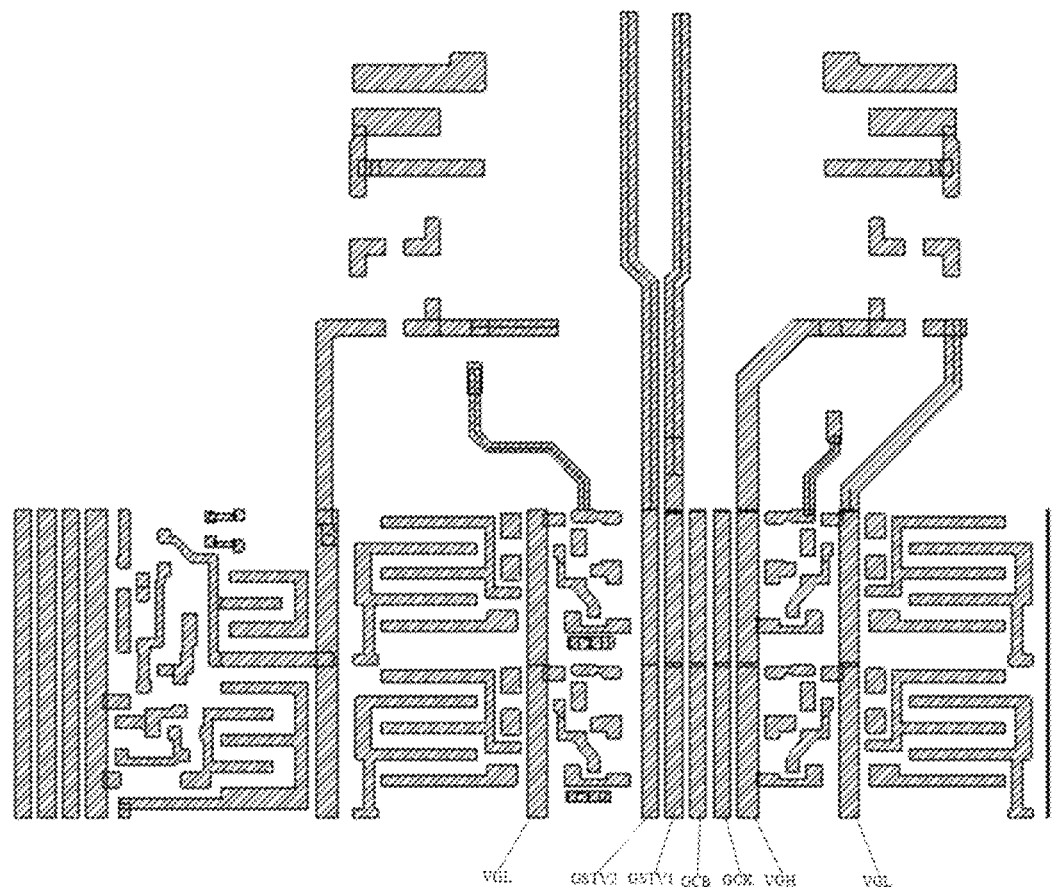
FIG. 17 is a schematic diagram illustrating a layout of a first source-drain metal layer in FIG. 13.

As shown in FIG. 9, FIG. 10 and FIG. 12, for example, on the left frame and/or the right frame of the display substrate, at least part of the first gate driving circuit Gate1-GOA and at least part of the second gate driving circuit Gate2-GOA are arranged symmetrically. Exemplarily, at least part arranged symmetrically includes transistors, capacitors and/or some conductive connection portions, etc., but not limited thereto.

Exemplarily, the orthographic projection of at least part of the first gate driving circuit Gate1-GOA on the base substrate of the display substrate, and the orthographic projection of at least part of the second gate driving circuit Gate2-GOA on the base substrate are arranged symmetrically with respect to the first symmetry axis, and the orthographic projection of the first symmetry axis on the base substrate is located between on the orthographic projection of the first gate driving circuit Gate1-GOA on the base substrate and the orthographic projection of the second gate driving circuit Gate2-GOA on the base substrate.

As shown in FIG. 9, FIG. 10 and FIG. 12, for example, when at least part of the first gate driving circuit Gate1-GOA and at least part of the second gate driving circuit Gate2-GOA are arranged symmetrically, the fourth transistor T4 in the first gate driving circuit Gate1-GOA is located on a side of the first gate driving circuit Gate1-GOA away from the second gate driving circuit Gate2-GOA. The fifth transistor T5 in the first gate driving circuit Gate1-GOA is located on a side of the first gate driving circuit Gate1-GOA away from the second gate driving circuit Gate2-GOA.

As shown in FIG. 9, FIG. 10 and FIG. 12, for example, when at least part of the first gate driving circuit Gate1-GOA and at least part of the second gate driving circuit Gate2-GOA are arranged symmetrically, the fourth transistor T4 in the second gate driving circuit Gate2-GOA is located on a side of the second gate driving circuit Gate2-GOA away from the first gate driving circuit Gate1-GOA. The fifth transistor T5 in the second gate driving circuit Gate2-GOA is located on a side of the second gate driving circuit Gate2-GOA away from the first gate driving circuit Gate1-GOA.

In the display substrate provided by the above embodiment, by setting at least part of the first gate driving circuit Gate1-GOA and at least part of the second gate driving circuit Gate2-GOA arranged symmetrically, the space occupied by the first gate driving circuit Gate1-GOA and the second gate driving circuit Gate2-GOA is reduced to the minimum, and at the same time, it is beneficial to realize the sharing of signal lines and achieve the purpose of narrowing the frame of the display substrate.

As shown in FIG. 7 to FIG. 12, in some embodiments, the first gate driving circuit Gate1-GOA and the second gate driving circuit Gate2-GOA share the first level signal line VGH, the first level signal line VGH transmits a DC signal having a first level.

Exemplarily, the first level signal line VGH includes at least a portion extending along the first direction, and the orthographic projection of the first gate driving circuit Gate1-GOA on the base substrate and the orthographic projection of the second gate driving circuit Gate2-GOA on the base substrate are arranged along a second direction, and the first direction intersects the second direction. Exemplarily, the first direction includes the longitudinal direction, and the second direction includes the transverse direction, but not limited thereto.

The above arrangement effectively reduces the frame width shared by the first gate driving circuit Gate1-GOA, the second gate driving circuit Gate2-GOA and the first level signal line VGH connected to them, which is not only beneficial to the narrow frame of the display substrate, but also effectively reduce the power consumption of the gate driving circuit.

As shown in FIG. 7 to FIG. 12, in some embodiments, at least part of the orthographic projection of the first level signal line VGH on the base substrate of the display substrate is located between the orthographic projection of the first gate driving circuit Gate1-GOA on the base substrate and the orthographic projection of the second gate driving circuit Gate2-GOA on the base substrate.

The above arrangement makes at least part of the first gate driving circuit Gate1-GOA and at least part of the second gate driving circuit Gate2-GOA respectively located on both sides of the first level signal line VGH, because the first level signal line VGH transmits a DC signal with a stable potential. Therefore, the above arrangement is beneficial for the first level signal line VGH to shield the signal interference between the first gate driving circuit Gate1-GOA and the second gate driving circuit Gate2-GOA, which effectively improves the stability of the display substrate.

As shown in FIG. 18 to FIG. 24, in some embodiments, the orthographic projection of the first level signal line VGH on the base substrate at least partially overlaps the orthographic projection of the first gate driving circuit Gate1-GOA on the base substrate; and/or, the orthographic projection of the first level signal line VGH on the base substrate at least partially overlaps the orthographic projection of the second gate driving circuit Gate2-GOA on the base substrate.

Exemplarily, the orthographic projection of the first level signal line VGH on the base substrate at least partially overlaps the orthographic projection of the transistor included in the first gate driving circuit Gate1-GOA on the base substrate; and/or, the orthographic projection of the first level signal line VGH on the base substrate at least partially overlaps the orthographic projection of the transistor included in the second gate driving circuit Gate2-GOA on the base substrate.

Figure 18:
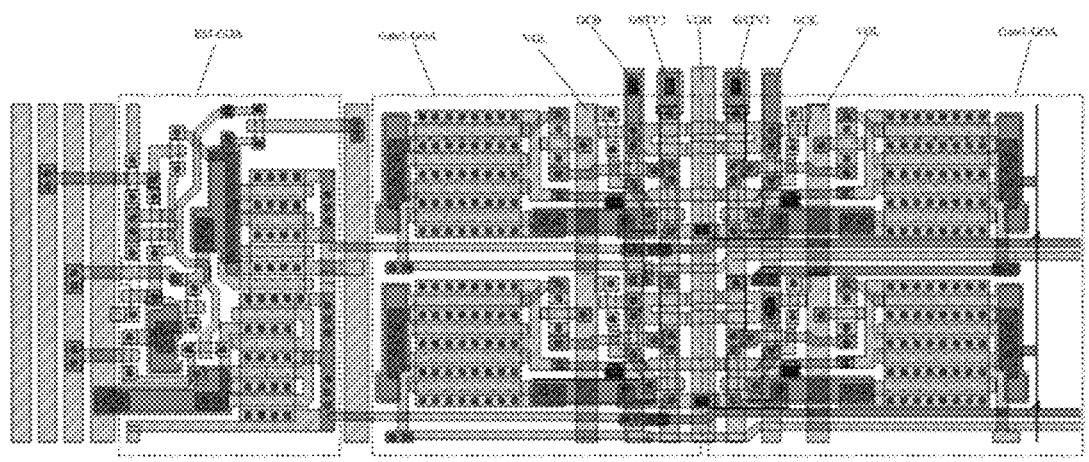
FIG. 18 is a schematic diagram illustrating a second layout of a gate driving circuit according to an embodiment of the present disclosure.
Figure 19:
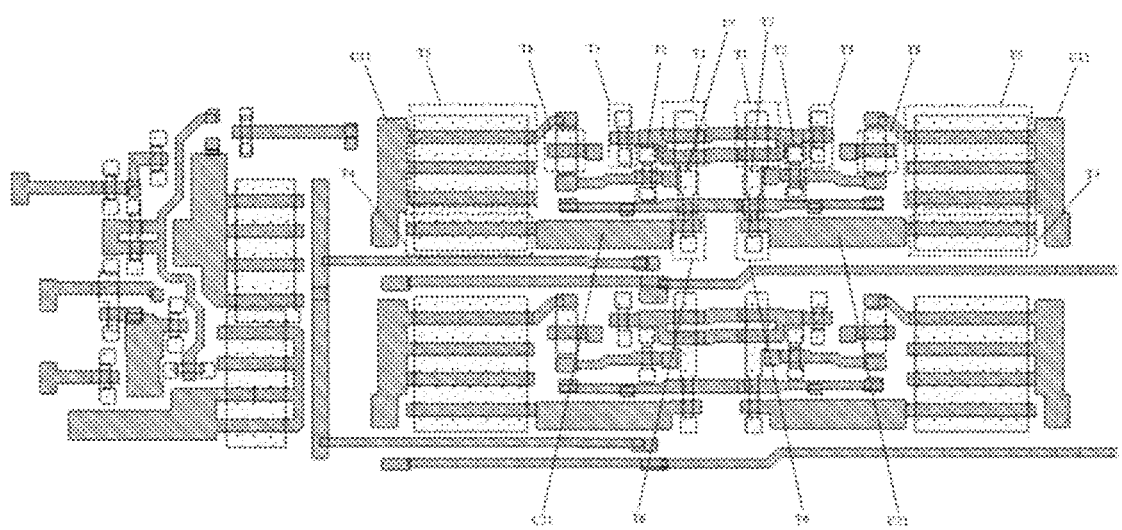
FIG. 19 is a schematic diagram illustrating a layout of an active layer and a first gate metal layer in FIG. 18.
Figure 20:
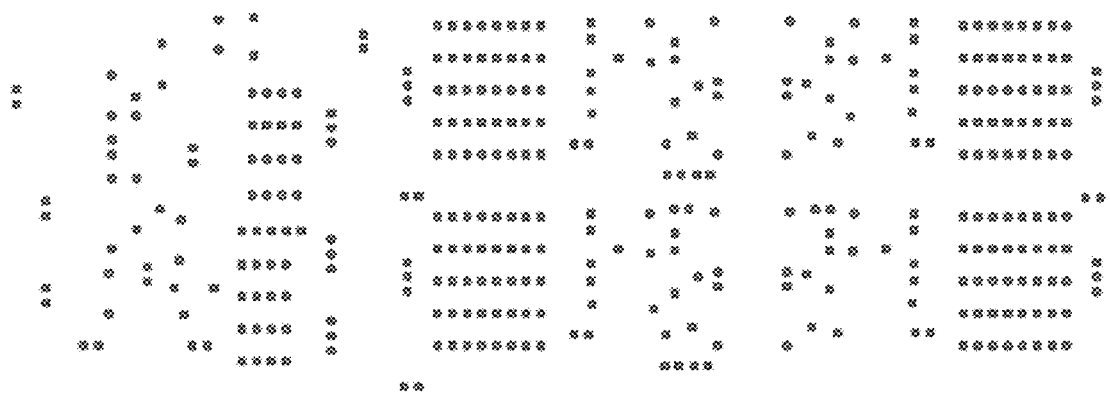
FIG. 20 is a schematic diagram illustrating a via hole formed on an interlayer insulating layer in FIG. 18.
Figure 21:
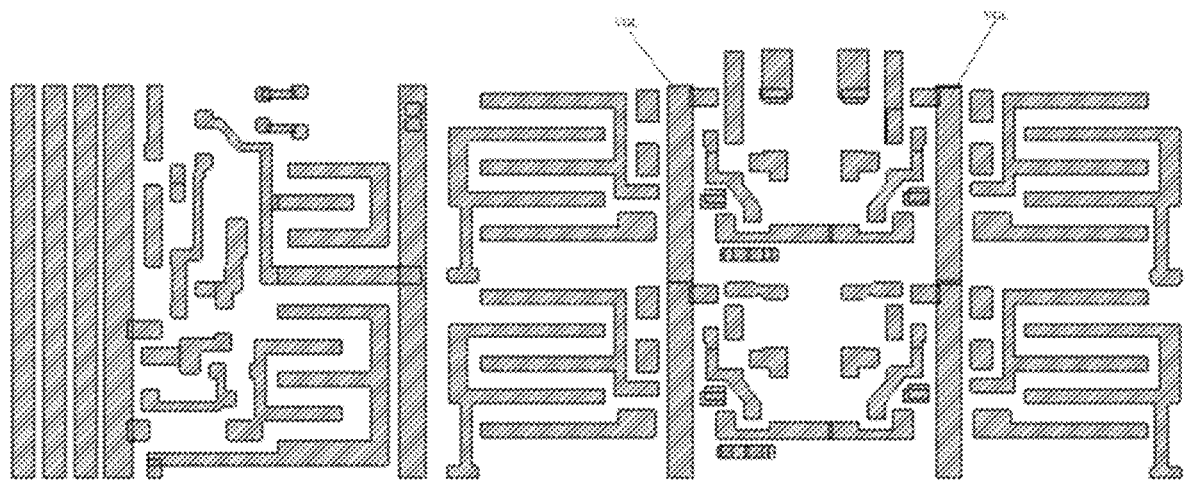
FIG. 21 is a schematic diagram illustrating a layout of a first source-drain metal layer in FIG. 18.
Figure 22:
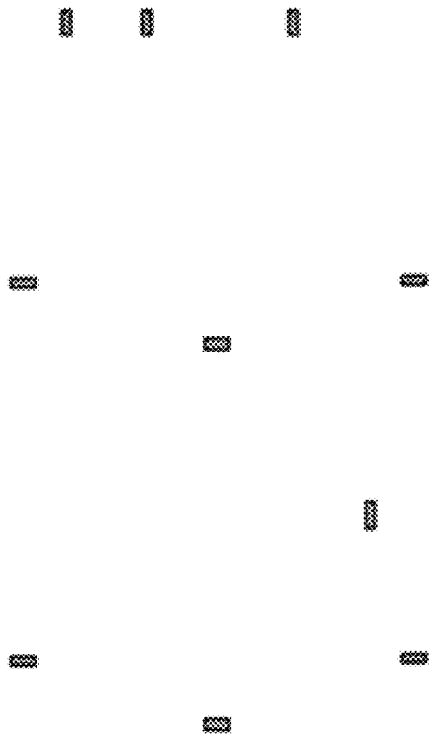
FIG. 22 is a schematic diagram illustrating a via hole formed on a first passivation layer in FIG. 18.
Figure 23:
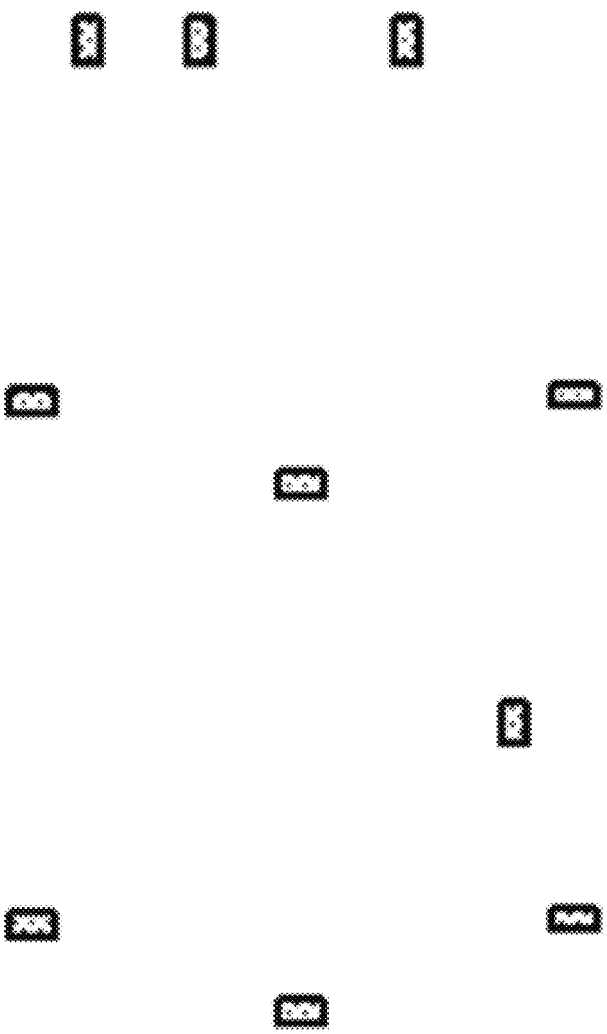
FIG. 23 is a schematic diagram illustrating a via hole formed on a first planarization layer in FIG. 18.

Exemplarily, as shown in FIG. 18 and FIG. 19, the orthographic projection of the first level signal line VGH on the base substrate at least partially overlaps the orthographic projection of the gate electrode of the first transistor T1 included in the first gate driving circuit Gate1-GOA, the orthographic projection of the first level signal line VGH on the base substrate at least partially overlaps the orthographic projection of the gate electrode of the seventh transistor T7 included in the first gate driving circuit GOA on the base substrate.

Exemplarily, as shown in FIG. 18 and FIG. 19, the orthographic projection of the first level signal line VGH on the base substrate at least partially overlaps the orthographic projection of the gate electrode of the first transistor T1 included in the second gate driving circuit Gate2-GOA on the base substrate; the orthographic projection of the first level signal line VGH on the base substrate at least partially overlaps the orthographic projection of the gate electrode of the seventh transistor T7 included in the second gate driving circuit Gate2-GOA on the base substrate.

The above setting method further reduces the frame width occupied by the first gate driving circuit Gate1-GOA, the second gate driving circuit Gate2-GOA and the signal lines connected to them, which is not only beneficial to the narrow frame of the display substrate, but also effectively reduce the power consumption of the gate driving circuit.

As shown in FIGS. 7 to 12 and FIGS. 18 to 24, in some embodiments, the first gate driving circuit Gate1-GOA and the second gate driving circuit Gate2-GOA share a first clock signal Line GCK and/or the second clock signal line GCB, the phase of the first clock signal transmitted by the first clock signal line GCK is opposite to that of the second clock signal transmitted by the second clock signal line GCB.

Exemplarily, the first clock signal line GCK includes at least a portion extending along the first direction, the second clock signal line GCB includes at least a portion extending along the first direction, and the first clock signal line GCK and the second clock signal line GCB are arranged along the second direction.

In the display substrate provided by the above embodiment, by setting the first gate driving circuit Gate1-GOA and the second gate driving circuit Gate2-GOA to share the first clock signal line GCK and/or the second clock signal line GCB, while ensuring normal driving of the first gate driving circuit Gate1-GOA and the second gate driving circuit Gate2-GOA, a group of clock signal lines can be reduced, thereby effectively reducing the width of the frame occupied by the first gate driving circuit Gate1-GOA, the second gate driving circuit Gate2-GOA and the signal lines connected to them, which not only facilitates the narrow frame of the display substrate, but also effectively reduces the power consumption of the gate driving circuit.

In some embodiments, at least part of the first gate driving circuit Gate1-GOA and at least part of the second gate driving circuit Gate2-GOA are arranged symmetrically with respect to a first symmetry axis;

The first symmetry axis at least partially overlaps the first clock signal line GCK, as shown in FIG. 7 to 12, or the first symmetry axis at least partially overlaps the second clock signal line GCB, as shown in FIG. 18 to FIG. 25, or the first symmetry axis at least partially overlaps the first level signal line VGH.

The first symmetry axis overlaps the common signal line, the first clock signal line GCK, second clock signal line GCB or first level signal line VGH, so that at least part of the first gate driving circuit Gate1-GOA and at least part of the second gate driving circuit Gate2-GOA can be respectively located on both sides of the common signal line, thereby ensuring the connection reliability between the first gate driving circuit Gate1-GOA and the second gate the driving circuit Gate2-GOA and the common signal line, reducing the layout difficulty of the first gate driving circuit Gate1-GOA and the second gate driving circuit Gate2-GOA.

The first symmetry axis overlaps at least part of the first level signal line VGH, so that at least part of the first gate driving circuit Gate1-GOA and at least part of the second gate driving circuit Gate2-GOA are respectively located on both sides of the first level signal line VGH. Since the first level signal line VGH transmits a DC signal with a stable potential, the above arrangement is beneficial to the first level signal line VGH to shield the signal interference between the first gate driving circuit Gate1-GOA and the second gate driving circuit Gate2-GOA, thereby effectively improving the stability of the display substrate.

As shown in FIGS. 18 to 25, in some embodiments, the orthographic projection of the first level signal line VGH on the base substrate is located between the orthographic projection of the first clock signal line GCK on the base substrate and the orthographic projection of the second clock signal line GCB on the base substrate.

The above arrangement enables the first clock signal line GCK and the second clock signal line GCB to be located on both sides of the first level signal line VGH, so that the first level signal line VGH effectively shields the interference between the first clock signal line GCK and the second clock signal line GCB, and the working stability of the gate driving circuit is ensured.

As shown in FIG. 18 to FIG. 24, in some embodiments, the orthographic projection of the first clock signal line GCK on the base substrate at least partially overlaps the orthographic projection of one of the first gate driving circuit Gate1-GOA and the second gate driving circuit Gate2-GOA on the base substrate; the orthographic projection of the second clock signal line GCB on the base substrate at least partially overlaps the orthographic projection of the other of the first gate driving circuit Gate1-GOA and the second gate driving circuit Gate2-GOA on the base substrate.

Exemplarily, the orthographic projection of the first clock signal line GCK on the base substrate at least partially overlaps the orthographic projection of the transistor included in one of the first gate driving circuit Gate1-GOA and the second gate driving circuit Gate2-GOA on the base substrate; the orthographic projection of the second clock signal line GCB on the base substrate at least partially overlaps the orthographic projection of the transistor included in the other of the first gate driving circuit Gate1-GOA and the second gate driving circuit Gate2-GOA on the base substrate.

Exemplarily, the orthographic projection of the first clock signal line GCK on the base substrate at least partially overlaps the orthographic projection of the capacitive structure included in one of the first gate driving circuit Gate1-GOA and the second gate driving circuit Gate2-GOA on the base substrate; the orthographic projection of the second clock signal line GCB on the base substrate at least partially overlaps the orthographic projection of the capacitive structures included in the other of the first gate driving circuit Gate1-GOA and the second gate driving circuit Gate2-GOA on the base substrate.

As shown in FIG. 18 and FIG. 19, the orthographic projection of the first clock signal line GCK on the base substrate at least partially overlaps the orthographic projection of the gate electrode of the first transistor T1 included in the first gate driving circuit Gate1-GOA, the orthographic projection of the active pattern of the second transistor T2 included in the first gate driving circuit Gate1-GOA on the base substrate, and the orthographic projection of the second capacitors included in the first gate driving circuit Gate1-GOA on the base substrate.

As shown in FIG. 18 and FIG. 19, the orthographic projection of the second clock signal line GCB on the base substrate at least partially overlaps the orthographic projection of the gate electrode of the first transistor T1 included in the second gate driving circuit Gate2-GOA on the base substrate, the orthographic projection of the active pattern of the second transistor T2 included in the second gate driving circuit Gate2-GOA on the base substrate, and the orthographic projection of the second capacitors included in the second gate driving circuit Gate2-GOA on the base substrate.

The above setting method further reduces the frame width occupied by the first gate driving circuit Gate1-GOA, the second gate driving circuit Gate2-GOA and the signal lines connected to them, which is not only beneficial to the narrow frame of the display substrate, but also effectively reduce the power consumption of the gate driving circuit.

As shown in FIGS. 7 to 12 and FIGS. 18 to 24, in some embodiments, the first gate driving circuit Gate1-GOA is coupled to the first frame start signal line GSTV1, and the second gate driving circuit Gate2-GOA is coupled to the second frame start signal line GSTV2.

Exemplarily, the first frame start signal line GSTV1 includes at least a portion extending along the first direction, and the second frame start signal line GSTV2 includes at least a portion extending along the first direction. The first frame start signal line GSTV1 and the second frame start signal line GSTV2 can be independently controlled.

In the display substrate provided by the above embodiment, the first gate driving circuit Gate1-GOA and the second gate driving circuit Gate2-GOA are set to connect to their respective original frame start signal lines, and keep connected to their respective original frame start signal lines, so that when the subsequent gate driving signal is debugged, it is still possible to control the first gate driving circuit Gate1-GOA and the second gate driving circuit Gate2-GOA to output different pulses by adjusting the respective connected frame start signals, so as to achieve the purpose of driving low-frequency pixels.

As shown in FIG. 7 to FIG. 12 and FIG. 18 to FIG. 24, in some embodiments, the orthographic projection of the first level signal line VGH on the base substrate is located between the orthographic projection of the first frame start signal line GSTV1 on the base substrate and the orthographic projection of the second frame start signal line GSTV2 on the base substrate.

The above arrangement enables the first frame start signal line GSTV1 and the second frame start signal line GSTV2 to be located on both sides of the first level signal line VGH respectively, so that the first level signal line VGH effectively shields the interference between the first frame start signal line GSTV1 and the second frame start signal line GSTV2, thereby ensuring the stability of the gate driving circuit.

Exemplarily, as shown in FIG. 7 to FIG. 12, in some embodiments, the first clock signal line GCK, the second clock signal line GCB, the first level signal line VGH, the first frame start signal line GSTV1, the second frame start signal GSTV2 are located between the first gate driving circuit Gate1-GOA and the second gate driving circuit Gate2-GOA. For example: the first frame start signal line GSTV1 and the second frame start signal GSTV2 are located on the same side of the second clock signal line GCB; the first clock signal line GCK and the first level signal line VGH are located on the same side of the second clock signal line GCB.

Exemplarily, as shown in FIGS. 7 to 12, in some embodiments, the first frame start signal line GSTV1 and the second frame start signal GSTV2 are located on the same side of the second clock signal line GCB, and the first frame start signal line GSTV1 is coupled to the first gate driving circuit Gate1-GOA, the second frame start signal line GSTV2 is coupled to the second gate driving circuit Gate2-GOA, and the distance between the first frame start signal line GSTV1 and the first gate driving circuit Gate1-GOA is greater than the distance between the second frame start signal line GSTV2 and the second gate driving circuit Gate2-GOA. For example: the distance between the first frame start signal line GSTV1 and the first transistor T1 of the first gate driving circuit Gate1-GOA (that is, the length of the line segment connecting the first transistor T1 of the first gate driving circuit Gate1-GOA and GSTV1) is greater than the distance between the second frame start signal line GSTV2 and the first transistor T1 of the second gate driving circuit Gate2-GOA (that is, the length of the line segment connecting the first transistor T1 of the second gate driving circuit Gate2-GOA and the second frame start signal line GSTV2).

Exemplarily, as shown in FIG. 7 to FIG. 12, in some embodiments, the distance between the output terminal of the first gate driving circuit Gate1-GOA and the sub-pixel (or sub-pixel driving circuit) is smaller than the distance between the output terminal of the second gate driving circuit Gate2-GOA and the same sub-pixel (or sub-pixel driving circuit). For example: the distance between the output terminal of the first gate driving circuit Gate1-GOA (such as the drain electrode of the fifth transistor T5) and the sub-pixel (or sub-pixel driving circuit) (such as: the length of the connecting line segment of GOUT1) is smaller than the distance from the output terminal of the second gate driving circuit Gate2-GOA (for example, the drain electrode of the fifth transistor T5) to the sub-pixel (or the sub-pixel driving circuit) (for example: the length of the connecting line segment of GOUT 2).

Exemplarily, as shown in FIG. 7 to FIG. 12, in some embodiments, the output terminal GOUT2 of the second gate driving circuit Gate2-GOA (the connecting line segment of the second gate driving circuit Gate2-GOA coupled to the sub-pixel) overlaps the first clock signal line GCK, the second clock signal line GCB, the first level signal line VGH, the first frame start signal line GSTV1, and the second frame start signal GSTV2. For example: the orthographic projection of the output terminal GOUT2 of the second gate driving circuit Gate2-GOA on the base substrate is vertical to the orthographic projections of the first clock signal line GCK, the second clock signal line GCB, and the first level signal line VGH, the first frame start signal line GSTV1 and the second frame start signal GSTV2 on the base substrate.

As shown in FIG. 18 to FIG. 24, in some embodiments, the orthographic projection of the first frame start signal line GSTV1 on the base substrate at least partially overlaps the orthographic projection of the first gate driving circuit Gate1-GOA on the base substrate; the orthographic projection of the second frame start signal line GSTV2 on the base substrate at least partially overlaps the orthographic projection of the second gate driving circuit Gate2-GOA on the base substrate.

Exemplarily, the orthographic projection of the first frame start signal line GSTV1 on the base substrate at least partially overlaps the orthographic projection of the transistors included in the first gate driving circuit Gate1-GOA on the base substrate; the orthographic projection of the second frame start signal line GSTV2 on the base substrate at least partially overlaps the orthographic projection of the transistors included in the second gate driving circuit Gate2-GOA on the base substrate.

As shown in FIG. 18 and FIG. 19, the orthographic projection of the first frame start signal line GSTV1 on the base substrate at least partially overlaps the orthographic projection of the active pattern of the first transistor T1 included in the first gate driving circuit Gate1-GOA on the base substrate, the orthographic projection of the active pattern of the sixth transistor T6 included in the first gate driving circuit Gate1-GOA on the base substrate, and the orthographic projection of the active patterns of the seventh transistor T7 included in the first gate driving circuit Gate1-GOA on the base substrate.

As shown in FIG. 18 and FIG. 19, the orthographic projection of the second frame start signal line GSTV2 on the base substrate at least partially overlaps the orthographic projection of the active pattern of the first transistor T1 included in the second gate driving circuit Gate2-GOA on the base substrate, the orthographic projection of the active pattern of the sixth transistor T6 included in the second gate driving circuit Gate2-GOA on the base substrate, and the orthographic projection of the active pattern of the seventh transistor T7 included in the second gate driving circuit Gate2-GOA on the base substrate.

The above arrangement further reduces the frame width jointly occupied by the first gate driving circuit Gate1-GOA, the second gate driving circuit Gate2-GOA and the frame start signal lines connected to them, which is not only beneficial to the narrow frame of the display substrate, also effectively reduces the power consumption of the gate driving circuit.

As shown in FIGS. 18 to 25, in some embodiments, the orthographic projection of the first frame start signal line GSTV1 on the base substrate and the orthographic projection of the second frame start signal line GSTV2 on the base substrate are located between the orthographic projection of the first clock signal line GCK on the base substrate and the orthographic projection of the second clock signal line GCB on the base substrate.

The above arrangement makes the distance between the first clock signal line GCK and the second clock signal line GCB relatively far, which shields the interference caused by signal jumps between the first clock signal line GCK and the second clock signal line GCB.

Figure 24:
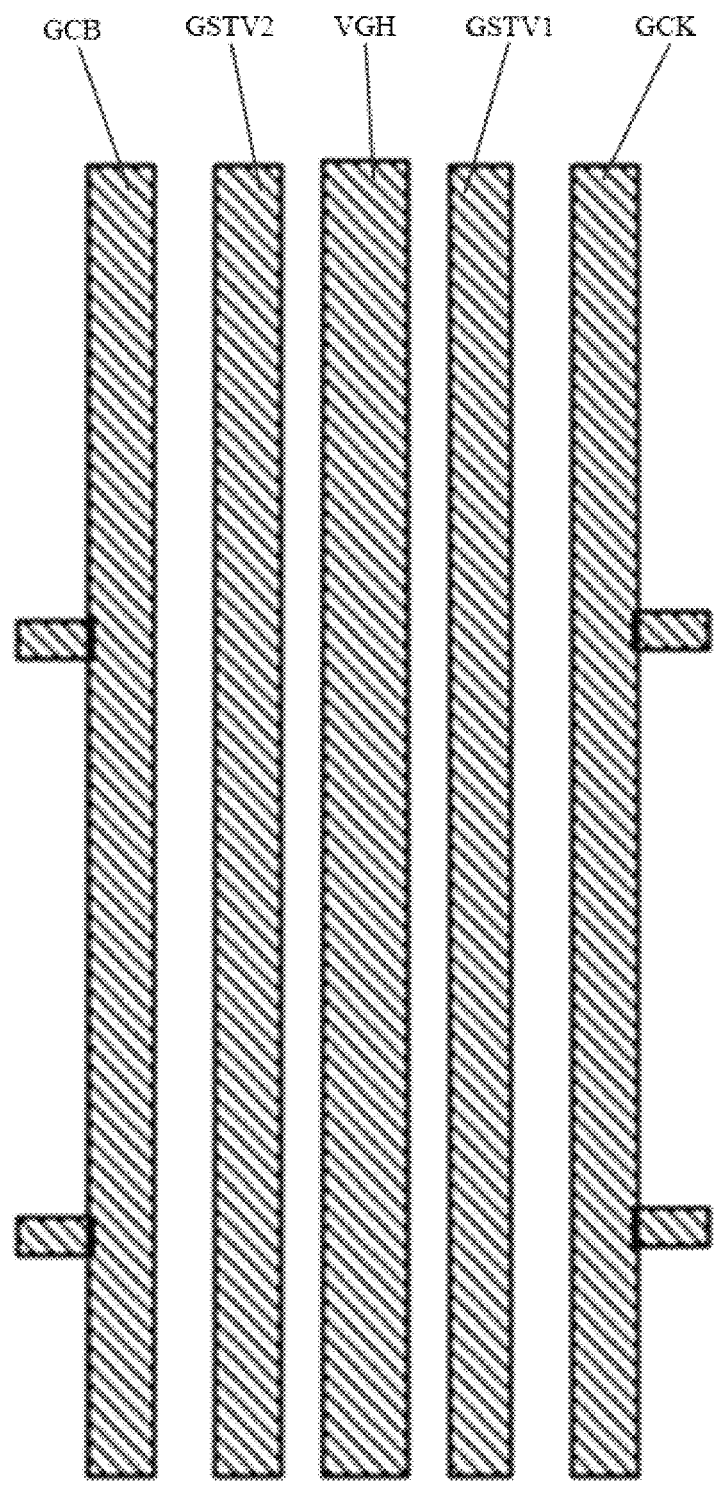
FIG. 24 is a schematic diagram illustrating a layout of a second source-drain metal layer in FIG. 18.

As shown in FIG. 24, in some embodiments, at least one of the first level signal line VGH, the first clock signal line GCK, the second clock signal line GCB, and the first frame start signal line GSTV1 and the second frame start signal line GSTV2 is made using the second source-drain metal layer in the display substrate.

Exemplarily, the display substrate includes an active layer, a first gate insulating layer, a first gate metal layer, a second gate insulating layer, a second gate metal layer, an interlayer insulating layer, a first source-drain metal layer, a first passivation layer, a first planarization layer, a second source-drain metal layer, a second passivation layer, a second planarization layer sequentially stacked on the base substrate in a direction away from the base substrate.

Exemplarily, at least one of the first level signal line VGH, the first clock signal line GCK, the second clock signal line GCB, the first frame start signal line GSTV1 and the second frame start signal line GSTV2 is made using a conductive layer on the side of the first source-drain metal layer away from the base substrate in the display substrate.

Setting at least one of the signal lines to be made using the second source-drain metal layer in the display substrate not only reduces the voltage drop of the signal line, but also prevents the short circuit between the signal line and the circuit structure below the signal line, thereby effectively improving the display substrate reliability.

As shown in FIG. 12, in some embodiments, at least one of the first level signal line VGH, the first clock signal line GCK, the second clock signal line GCB, the first frame start signal line GSTV1 and the second frame start signal line GSTV2 is made using the first source-drain metal layer in the display substrate.

In some embodiments, at least one of the first level signal line VGH, the first clock signal line GCK, the second clock signal line GCB, the first frame start signal line GSTV1 and the second frame the starting signal line GSTV2 includes two layers of conductive layers stacked to each other, one conductive layer is made of the second source-drain metal layer, and the other conductive layer is made of the third source-drain metal layer in the display substrate.

Exemplarily, the display substrate further includes the third source-drain metal layer, and the third source-drain metal layer is located on a side of the second source-drain metal layer away from the base substrate.

at least one of the signal lines includes two layers of conductive layers stacked to each other, one conductive layer is made of the second source-drain metal layer, and the other conductive layer is made of the third source-drain metal layer in the display substrate, which is not only beneficial to reduce the voltage drop of the signal line, but also avoids the short circuit between the signal line and the circuit structure below the signal line, which effectively improves the reliability of the display substrate.

As shown in FIG. 18 and FIG. 19, in some embodiments, the width-to-length ratio of the channel of the output transistor included in the first gate driving circuit Gate1-GOA is equal to the width-to-length ratio of the channel of the output transistor included in the second gate driving circuit Gate2-GOA.

Exemplarily, the output transistors include a fourth transistor T4 and a fifth transistor T5.

The above arrangement is more conducive to achieving mirror symmetry between the first gate driving circuit Gate1-GOA and the second gate driving circuit Gate2-GOA, and is conducive to narrowing the frame of the display substrate.

Figure 25:
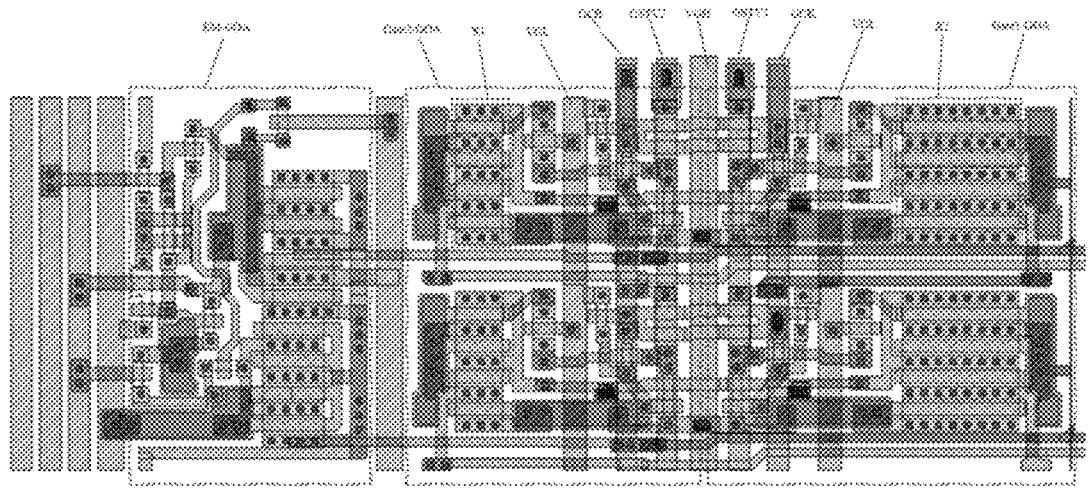
FIG. 25 is a schematic diagram illustrating a third layout of a gate driving circuit according to an embodiment of the present disclosure.

As shown in FIG. 25, in some embodiments, the width-to-length ratio of the channel of the output transistor included in the first gate driving circuit Gate1-GOA is greater than the width-to-length ratio of the channel of the output transistor included in the second gate driving circuit Gate2-GOA.

Exemplarily, the width-to-length ratio of the channel of the output transistor included in the first gate driving circuit Gate1-GOA is 1.25 times, 1.5 times or 2.0 times the width-to-length ratio of the channel of the output transistor included in the second gate driving circuit Gate2-GOA, but not limited to this.

In the above, the width-to-length ratio of the channel of the output transistor included in the first gate driving circuit Gate1-GOA and the width-to-length ratio of the channel of the output transistor included in the second gate driving circuit Gate2-GOA are designed differently, which is not only compatible with the high-frequency driving mode and the low-frequency driving mode at the same time, but also further reduce the frame width of the display substrate.

As shown in FIG. 19, in some embodiments, at least part of target devices having the same function in the first gate driving circuit Gate1-GOA and the second gate driving circuit Gate2-GOA are coupled to each other.

Exemplarily, the target devices with the same function include a first transistor T1 and a seventh transistor T7. The gate electrode of the first transistor T1 in the first gate driving circuit Gate1-GOA is coupled to the gate electrode of the first transistor T1 in the second gate driving circuit Gate2-GOA. The gate electrode of the seventh transistor T7 in the first gate driving circuit Gate1-GOA is coupled to the gate electrode of the seventh transistor T7 in the second gate driving circuit Gate2-GOA.

As shown in FIG. 18 and FIG. 19, the target devices with the same function also include a second capacitor C2, the second electrode plate C22 of the second capacitor C2 in the first gate driving circuit Gate1-GOA is coupled to the second electrode plate C22 of the second capacitor C2 in the second gate driving circuit Gate2-GOA and connected to the first level signal line VGH through a via hole.

The above setting method is beneficial to reduce the wiring length of the signal node, and when the signal is shared, the electrical connection with the shared signal line can be realized through a via hole, which is beneficial to simplify the circuit structure.

Figure 4:
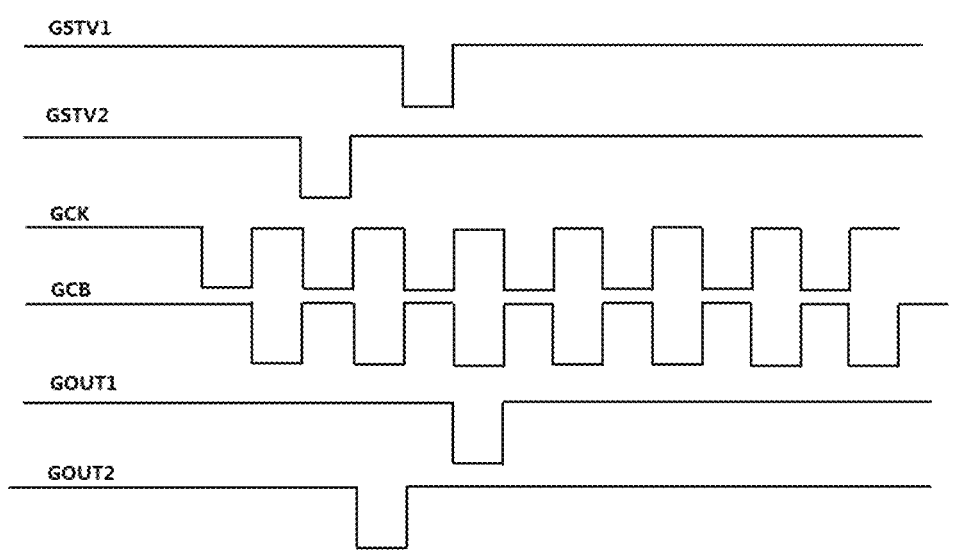
FIG. 4 is a timing diagram showing a gate driving circuit driving the 8T1C circuit structure according to an embodiment of the present disclosure.

As shown in FIGS. 2 to 4, in some embodiments, the display substrate further includes a plurality of first sub-pixel driving circuits, a plurality of light emitting elements, a plurality of data lines Vdata, a plurality of second initialization signal lines VINIT2 and a plurality of third initialization signal lines VINIT3, the first sub-pixel driving circuit includes a first driving transistor T23, a first data writing-in transistor T24, a first compensation transistor T22, a second reset transistor T27 and a third reset transistor T28;

The gate electrode of the first data writing-in transistor T24 is coupled to the output terminal of the corresponding first gate driving circuit Gate1-GOA, and the first electrode of the first data writing-in transistor T24 is coupled to the corresponding data line Vdata, and the second electrode of the first data writing-in transistor T24 is coupled to the first electrode of the first driving transistor T23;

The gate electrode of the first compensation transistor T22 is coupled to the output terminal of the corresponding first gate driving circuit Gate1-GOA, and the first electrode of the first compensation transistor T22 is coupled to the second electrode of the first driving transistor T23, the second electrode of the first compensation transistor T22 is coupled to the gate electrode of the first driving transistor T23;

The gate electrode of the second reset transistor T27 is coupled to the output terminal of the corresponding second gate driving circuit Gate2-GOA, and the first electrode of the second reset transistor T27 is coupled to the corresponding second initialization signal The line VINIT2, and the second electrode of the second reset transistor T27 is coupled to the corresponding light emitting element;

The gate electrode of the third reset transistor T28 is coupled to the output terminal of the corresponding second gate driving circuit Gate2-GOA, and the first electrode of the third reset transistor T28 is coupled to the corresponding third initialization signal line VINIT3, and the second electrode of the third reset transistor T28 is coupled to the first electrode of the first driving transistor T23.

Exemplarily, the display substrate further includes: a plurality of first initialization signal lines VINIT1, a plurality of first scan lines Gate1, a plurality of second scan lines Gate2, a plurality of reset lines Reset, a plurality of light emitting control lines, a plurality of power line VDD. The sub-pixel driving circuit includes an 8T1C circuit structure. The sub-pixel driving circuit further includes: a first reset transistor T21, a first power control transistor T25 and a first light emitting control transistor T26.

Exemplarily, the first initialization signal line VINIT1 transmits a first initialization signal, the second initialization signal line VINIT2 transmits a second initialization signal, the third initialization signal line VINIT3 transmits a third initialization signal, and the first scanning line Gate1 transmits the first gate driving signal GOUT1, the second scanning line Gate2 transmits the second gate driving signal GOUT2, the light emitting control line transmits the light emitting control signal EM, and the reset line Reset transmits a reset signal, the power line VDD transmits a power signal.

The gate electrode of the first reset transistor T21 is coupled to the corresponding reset line Reset, the first electrode of the first reset transistor T21 is coupled to the corresponding first initialization signal line VINIT1, and the second electrode of the first reset transistor T21 is coupled to the gate electrode of the first driving transistor T23.

The gate electrode of the first power control transistor T25 is coupled to the corresponding light emitting control line, the first electrode of the first power control transistor T25 is coupled to the corresponding power line VDD, and the second electrode of the first power control transistor T25 is coupled to the first electrode of the first driving transistor T23.

The gate electrode of the first light emitting control transistor T26 is coupled to the corresponding light emitting control line, the first electrode of the first light emitting control transistor T26 is coupled to the second electrode of the first driving transistor T23, the second electrode of the first light emitting control transistor T26 is coupled to the corresponding light emitting element. The cathode of the light emitting element receives a negative power signal VSS.

The gate electrode of the first data writing-in transistor T24 is coupled to the output terminal of the corresponding first gate driving circuit Gate1-GOA through the corresponding first scan line Gate1.

The gate electrode of the first compensation transistor T22 is coupled to the output terminal of the corresponding first gate driving circuit Gate1-GOA through the corresponding first scan line Gate1.

The gate electrode of the second reset transistor T27 is coupled to the output terminal of the corresponding second gate driving circuit Gate2-GOA through the corresponding second scan line Gate2.

The gate electrode of the third reset transistor T28 is coupled to the output terminal of the corresponding second gate driving circuit Gate2-GOA through the corresponding second scan line Gate2.

Figure 5:
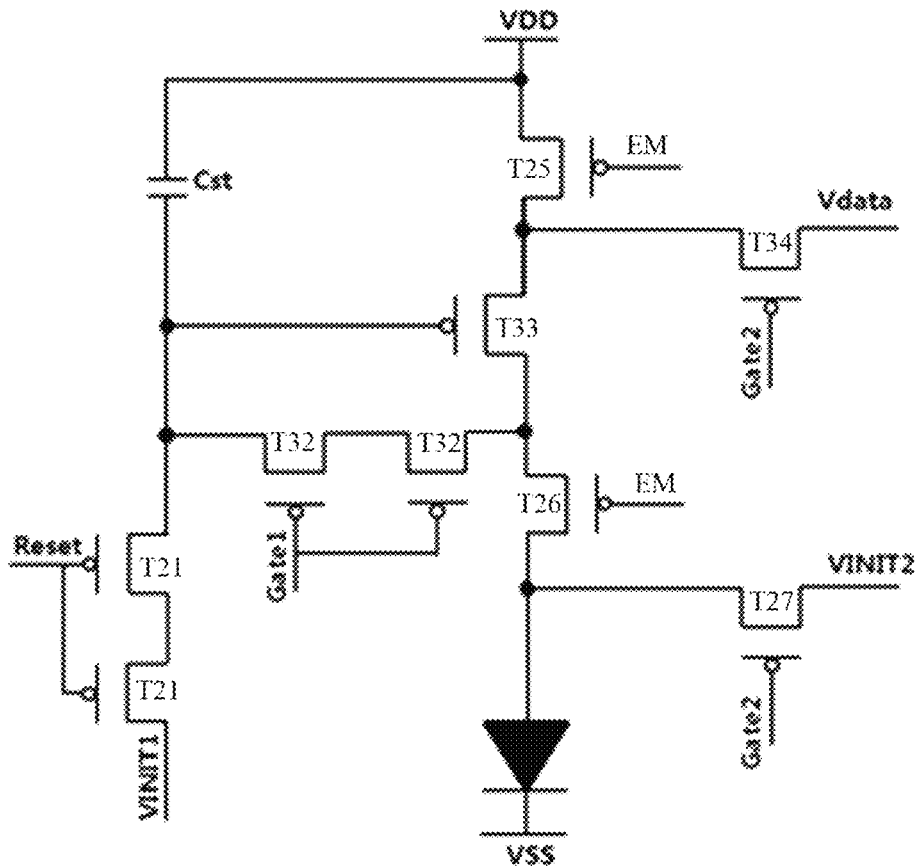
FIG. 5 is a schematic diagram showing the circuit structure of a 7T1C according to an embodiment of the present disclosure.
Figure 6:
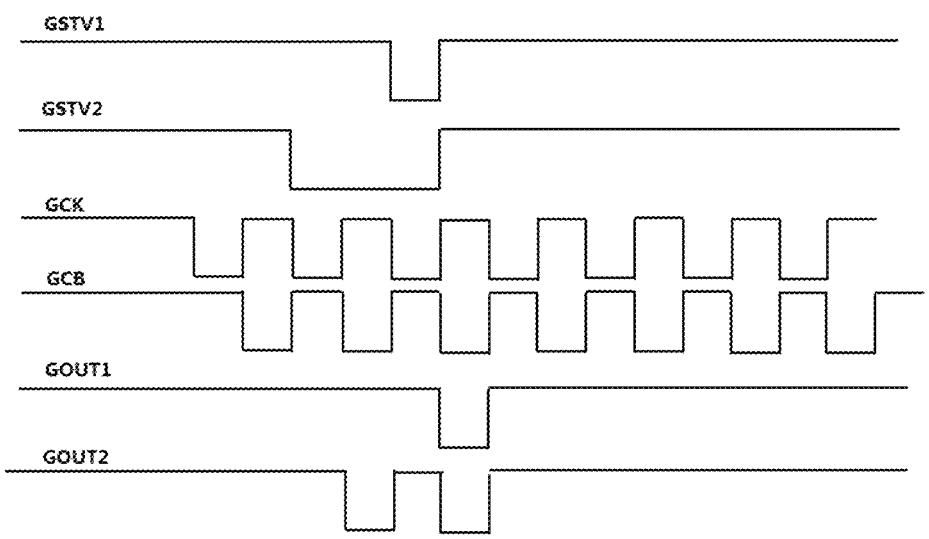
FIG. 6 is a timing diagram showing a gate driving circuit driving the 7T1C circuit structure according to an embodiment of the present disclosure.
Figure 7:
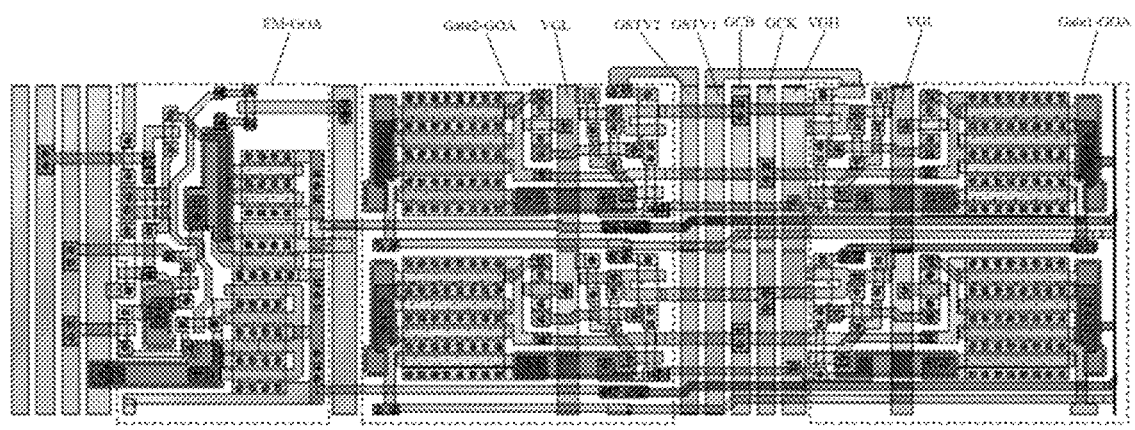
FIG. 7 is a schematic diagram illustrating a first layout of a gate driving circuit according to an embodiment of the present disclosure.
Figure 8:
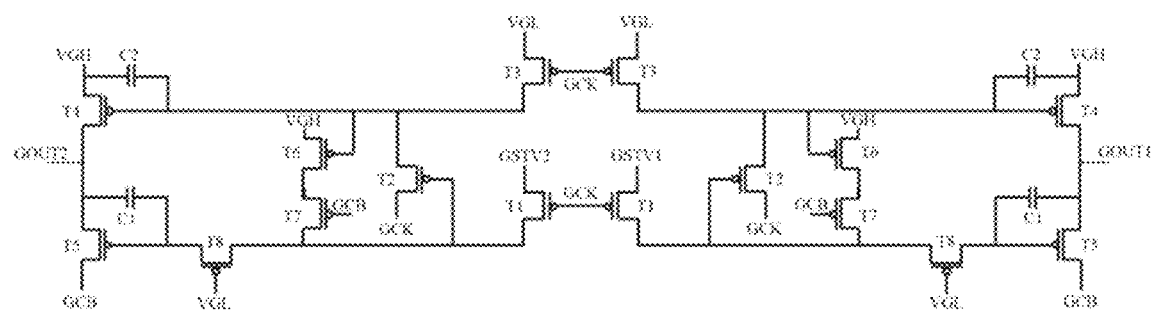
FIG. 8 is a schematic diagram illustrating a first layout of a first gate driving circuit and a second gate driving circuit according to an embodiment of the present disclosure.

As shown in FIG. 5 and FIG. 6, in some embodiments, the display substrate further includes a plurality of second sub-pixel driving circuits, a plurality of light emitting elements, a plurality of data lines Vdata and a plurality of second initialization signal lines VINIT2. The second sub-pixel driving circuit includes a second driving transistor T33, a second data writing-in transistor T34, a second compensation transistor T32 and a second reset transistor T27;

The gate electrode of the second data writing-in transistor T34 is coupled to the output terminal of the corresponding second gate driving circuit Gate2-GOA, and the first electrode of the second data writing-in transistor T34 is coupled to the corresponding data line Vdata, and the second electrode of the second data writing-in transistor T34 is coupled to the first electrode of the second driving transistor T33;

The gate electrode of the second compensation transistor T32 is coupled to the output terminal of the corresponding first gate driving circuit Gate1-GOA, and the first electrode of the second compensation transistor T32 is connected to the second electrode of the second driving transistor T33, the second electrode of the second compensation transistor T32 is coupled to the gate electrode of the second driving transistor T33;

The gate electrode of the second reset transistor T27 is coupled to the output terminal of the corresponding second gate driving circuit Gate2-GOA, and the first electrode of the second reset transistor T27 is coupled to the corresponding second initialization signal line VINIT2, and the second electrode of the second reset transistor T27 is coupled to the corresponding light emitting element.

Exemplarily, the display substrate further includes: a plurality of first initialization signal lines VINIT1, a plurality of first scan lines Gate1, a plurality of second scan lines Gate2, a plurality of reset lines Reset, a plurality of light emitting control lines, a plurality of power lines VDD. The sub-pixel driving circuit includes a 7T1C circuit structure. The sub-pixel driving circuit further includes: a first reset transistor T21, a first power control transistor T25 and a first light emitting control transistor T26.

Exemplarily, the first initialization signal line VINIT1 transmits a first initialization signal, the second initialization signal line VINIT2 transmits a second initialization signal, the first scan line Gate1 transmits a first gate driving signal GOUT1, and the second scanning line Gate2 transmits a second gate driving signal GOUT2, the light emitting control line transmits a light emitting control signal EM, the reset line Reset transmits a reset signal, and the power line VDD transmits a power signal.

The gate electrode of the first reset transistor T21 is coupled to the corresponding reset line Reset, the first electrode of the first reset transistor T21 is coupled to the corresponding first initialization signal line VINIT1, and the second electrode of the first reset transistor T21 is coupled to the gate electrode of the second driving transistor T33.

The gate electrode of the first power control transistor T25 is coupled to the corresponding light emitting control line, the first electrode of the first power control transistor T25 is coupled to the corresponding power line VDD, and the second electrode of the first power control transistor T25 is coupled to the first electrode of the second driving transistor T33.

The gate electrode of the first light emitting control transistor T26 is coupled to the corresponding light emitting control line, the first electrode of the first light emitting control transistor T26 is coupled to the second electrode of the second driving transistor T33, the second electrode of the first light emitting control transistor T26 is coupled to the corresponding light emitting element. The cathode of the light emitting element receives a negative power signal VSS.

The gate electrode of the second data writing-in transistor T34 is coupled to the output terminal of the corresponding second gate driving circuit Gate2-GOA through the corresponding second scan line Gate2.

The gate electrode of the second compensation transistor T32 is coupled to the output terminal of the corresponding first gate driving circuit Gate1-GOA through the corresponding first scan line Gate1.

The gate electrode of the second reset transistor T27 is coupled to the output terminal of the corresponding second gate driving circuit Gate2-GOA through the corresponding second scan line Gate2.

When the sub-pixel driving circuit with the above 7T1C structure is used, in high and low frequency applications, the gate driving signals of the second compensation transistor T32 and the second data writing-in transistor T34 are provided by different gate driving circuits. At this time, the first gate driving circuit Gate1-GOA connected to the second compensation transistor T32 and the second gate driving circuit Gate2-GOA connected to the second data writing-in transistor T34 have mirror symmetry, and other signal lines except the frame start signal line can be shared.

When the display substrate adopts the first sub-pixel driving circuit and the second sub-pixel driving circuit, the problem of low-frequency flickering can be effectively improved.

As shown in FIGS. 13 to 17, in some embodiments, the display substrate further includes:
  a first electrostatic discharge circuit (including a thirteenth transistor T13, a fourteenth transistor T14, a fifteenth transistor T15 and a sixteenth transistor T16), the first electrostatic discharge circuit is coupled to the first gate driving circuit Gate1-GOA;
  A second electrostatic discharge circuit (including a ninth transistor T9, a tenth transistor T10, an eleventh transistor T11 and a twelfth transistor T12), the second electrostatic discharge circuit is coupled to the second gate driving circuit Gate2-GOA;
  The first electrostatic discharge circuit and the second electrostatic discharge circuit are mirror symmetry, and the first electrostatic discharge circuit and the second electrostatic discharge circuit share at least one signal line.

In the display substrate provided by the above embodiment, the first electrostatic discharge circuit and the second electrostatic discharge circuit are mirror symmetry, the first electrostatic discharge circuit and the second electrostatic discharge circuit share at least one signal line, which is more conducive to the narrow frame of the display substrate.

In some embodiments, the first electrostatic discharge circuit and the second electrostatic discharge circuit share the first level line VGH and/or the second level line VGL.

Figure 26:
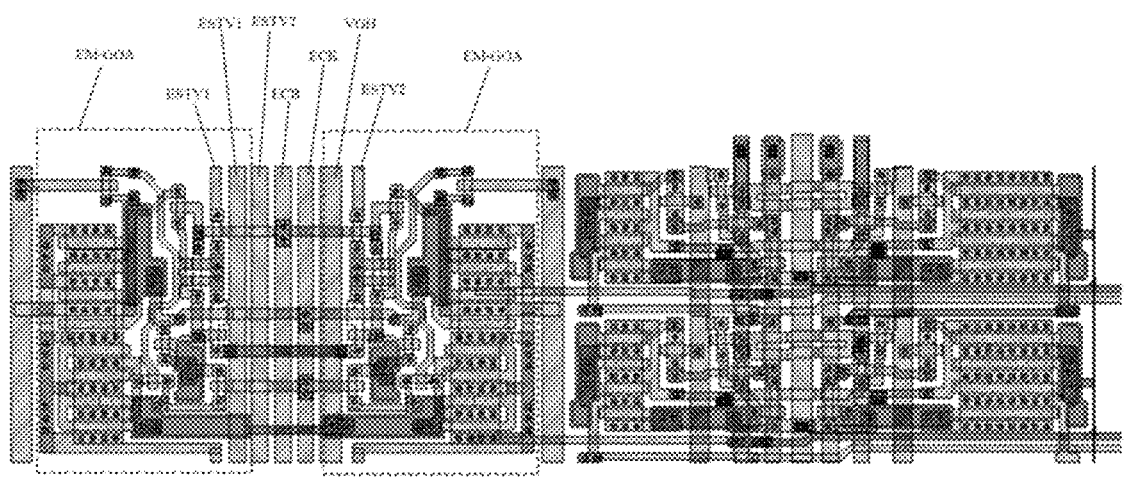
FIG. 26 is a schematic diagram illustrating a fourth layout of a gate driving circuit according to an embodiment of the present disclosure.

As shown in FIG. 26, in some embodiments, the peripheral area further includes:
  A plurality of light emitting control driving circuits EM-GOA, the plurality of light emitting control driving circuits EM-GOA are divided into a plurality of groups of light emitting control driving circuits EM-GOA, each group of light emitting control driving circuits EM-GOA includes two light emitting control driving circuit EM-GOA that are mirror symmetry, the two light emitting control driving circuits EM-GOA share at least one signal line.

As shown in FIG. 26, exemplary, the shared at least one signal line includes: at least one signal line among the first level signal line VGH, the third clock signal line ECK and the fourth clock signal line ECB.

As shown in FIG. 26, among the two light emitting control driving circuits EM-GOA arranged in a mirror symmetry, one light emitting control driving circuit EM-GOA is connected to the third frame start signal line ESTV1, and the other light emitting control driving circuit EM-GOA is connected the fourth frame start signal line ESTV2. The third frame start signal line ESTV1 and the fourth frame start signal line ESTV2 can be independently controlled.

Exemplarily, one light emitting control driving circuit EM-GOA can be used to control the first power control transistor T25 in FIG. 2 or FIG. 5, and another light emitting control driving circuit EM-GOA can be used to control the first power controls transistor T25 in FIG. 2 or FIG. 5.

Exemplarily, the display substrate includes a low temperature polysilicon oxide display substrate.

Figure 27:
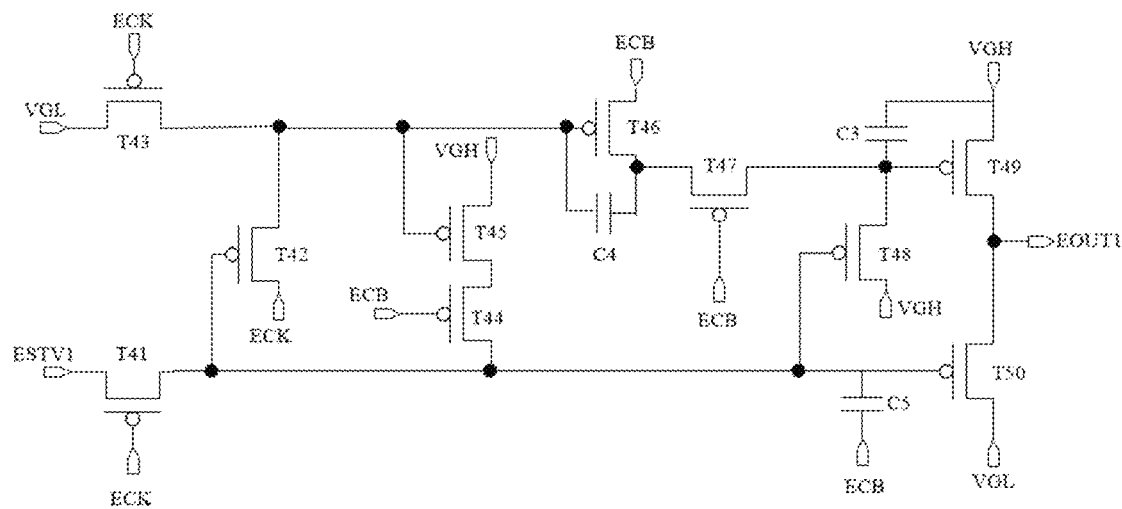
FIG. 27 illustrates a circuit structure of a light emitting control driving circuit according to an embodiment of the present disclosure.

It should be noted that the light emitting control driving circuit EM-GOA can adopt the circuit structure as shown in FIG. 27, but it is not limited thereto. FIG. 27 shows that the light emitting control driving circuit EM-GOA includes a forty-first transistor T41, a forty-second transistor T42, a forty-third transistor T43, a forty-fourth transistor T44, a forty-fifth transistor T45, a fourth-sixth transistor T46, a forty-seventh transistor T47, a forty-eighth transistor T48, a forty-ninth transistor T49, a fiftieth transistor T50, a third capacitor C3, a fourth capacitor C4, a fifth capacitor C5, and the output terminal EOUT1 of the light emitting control driving circuit EM-GOA.

An embodiment of the present disclosure also provides a display device, including the above-mentioned display substrate.

It should be noted that the display device can be any product or component with a display function such as a TV, a monitor, a digital photo frame, a mobile phone, a tablet computer, etc., wherein the display device also includes a flexible circuit board, a printed circuit board and a back plate, etc.

In the display substrate provided by the above embodiments, by setting the display substrate to include a plurality of first gate driving circuits and a plurality of second gate driving circuits, the low-frequency flicker problem of the display substrate is effectively improved. Moreover, by arranging the first gate driving circuit and the second gate driving circuit to share at least one signal line, the frame width occupied by the first gate driving circuit, the second gate driving circuit and the signal lines connecting them are effectively reduced, which is not only conducive to narrowing the frame of the display substrate, but also effectively reduces the power consumption of the gate driving circuit.

Therefore, when the display device provided by the embodiments of the present disclosure includes the above-mentioned display substrate, it also has the above-mentioned beneficial effects, which will not be repeated here.

An embodiment of the present disclosure also provides a method of manufacturing a display substrate, and the method includes:

Manufacturing a plurality of first gate driving circuits and a plurality of second gate driving circuits, the first gate driving signal output by the first gate driving circuit and the second gate driving signal output by the second gate driving circuit have different timing; the first gate driving circuit and the second gate driving circuit share at least one signal line.

In the display substrate provided by the embodiments of the present disclosure, by setting the display substrate to include a plurality of first gate driving circuits and a plurality of second gate driving circuits, the low-frequency flicker problem of the display substrate is effectively improved. Moreover, by arranging the first gate driving circuit and the second gate driving circuit to share at least one signal line, the frame width jointly occupied by the first gate driving circuit, the second gate driving circuit and the signal lines connecting them is effectively reduced, which is not only conducive to narrowing the frame of the display substrate, but also effectively reduces the power consumption of the gate driving circuit.

It should be noted that the extension of the signal line along a certain direction means: the signal line includes a main part and a secondary part connected to the main part, the main part is a line, a line segment or a bar-shaped body, and the main part extends along a certain direction, and the length of the main part extending in a certain direction is greater than the length of the secondary part extending in other directions.

It should be noted that "same layer" in the embodiments of the present disclosure may refer to film layers on the same structural layer. Or, for example, the film layers in the same layer may be a layer structure formed by using the same film forming process to form a film layer for forming a specific pattern, and then using the same mask to pattern the film layer through a patterning process. Depending on the specific pattern, one patterning process may include a plurality of exposure, development or etching processes, and the specific pattern in the formed layer structure may be continuous or discontinuous. These specific patterns may also be at different heights or have different thicknesses.

In each method embodiment of the present disclosure, the serial numbers of the steps cannot be used to limit the order of the steps. For those of ordinary skill in the art, the order of the steps can be changed without creative work. It is also within the protection scope of the present disclosure.

It should be noted that each embodiment in the present disclosure is described in a progressive manner, the same and similar parts of each embodiment can be referred to each other, and each embodiment focuses on the differences from other embodiments. In particular, for the method embodiments, since they are basically similar to the product embodiments, the description is relatively simple, and relevant parts may refer to part of the description of the product embodiments.

Unless otherwise defined, the technical terms or scientific terms used in the present disclosure shall have the usual meanings understood by those skilled in the art to which the present disclosure belongs. "First", "second" and similar words used in the present disclosure do not indicate any order, quantity or importance, but are only used to distinguish different components. "Comprising" or "including" and similar words mean that the elements or items appearing before the word include the elements or items listed after the word and their equivalents, without excluding other elements or items. Words such as "connected" or "coupled" are not limited to physical or mechanical connections, but may include electrical connections, whether direct or indirect. "Up", "Down", "Left", "Right" and so on are only used to indicate the relative positional relationship. When the absolute position of the described object changes, the relative positional relationship may also change accordingly.

It will be understood that when an element such as a layer, film, region, or substrate is referred to as being "on" or "under" another element, it can be "directly on" or "under" the other element, or intervening elements may be present.

In the description of the above embodiments, specific features, structures, materials or characteristics may be combined in any one or more embodiments or examples in an appropriate manner.

The above embodiments are for illustrative purposes only, but the present disclosure is not limited thereto. Obviously, those skilled in the art may make further modifications and improvements without departing from the spirit of the present disclosure, and these modifications and improvements shall also fall within the scope of the present disclosure.

What is claimed is:

1. A display substrate, comprising: a plurality of first gate driving circuits and a plurality of second gate driving circuits, wherein a first gate driving signal output by the first gate driving circuit and a second gate driving signal output by the second gate driving circuit have different timing; the first gate driving circuit and the second gate driving circuit share at least one signal line;
    wherein the first gate driving circuit and the second gate driving circuit share a first level signal line, and the first level signal line transmits a DC signal having a first level;
    wherein the first gate driving circuit and the second gate driving circuit share a first clock signal line and/or a second clock signal line, a phase of a first clock signal transmitted by the first clock signal line is opposite to a phase of a second clock signal transmitted by the second clock signal line;
    wherein the first gate driving circuit is coupled to a first frame start signal line, and the second gate driving circuit is coupled to a second frame start signal line;
    wherein at least one of the first level signal line, the first clock signal line, the second clock signal line, and the first frame start signal line and the second frame start signal line is made using a second source-drain metal layer in the display substrate; and
    wherein at least one of the first level signal line, the first clock signal line, the second clock signal line, the first frame start signal line and the second frame start signal line includes two layers of conductive layers stacked to each other, one layer of conductive layer is made of the second source-drain metal layer, and the other layer of conductive layer is made of a third source-drain metal layer in the display substrate.

2. The display substrate according to claim 1, wherein the display substrate comprises a display area and a peripheral area surrounding the display area; the plurality of first gate driving circuits and the plurality of second gate driving circuits are all arranged in the peripheral area;
    at least part of the first gate driving circuits and at least part of the second gate driving circuits are symmetrically arranged in a peripheral area close to a same side of the display area.

3. The display substrate according to claim 1, wherein at least part of an orthographic projection of the first level signal line on a base substrate of the display substrate is located between an orthographic projection of the first gate driving circuit on the base substrate and an orthographic projection of the second gate driving circuit on the base substrate.

4. The display substrate according to claim 3, wherein the orthographic projection of the first level signal line on the base substrate at least partially overlaps the orthographic projection of the first gate driving circuit on the base substrate; and/or, the orthographic projection of the first level signal line on the base substrate at least partially overlaps the orthographic projection of the second gate driving circuit on the base substrate.

5. The display substrate according to claim 1, wherein at least part of the first gate driving circuits and at least part of the second gate driving circuits are arranged symmetrically with respect to a first symmetry axis; the first symmetry axis at least partially overlaps the first clock signal line, or the first symmetry axis at least partially overlaps the second clock signal line, or the first symmetry axis at least partially overlaps the first level signal line.

6. The display substrate according to claim 1, wherein the orthographic projection of the first level signal line on the base substrate is located between an orthographic projection of the first clock signal line on the base substrate and an orthographic projection of the second clock signal line on the base substrate.

7. The display substrate according to claim 1, wherein the orthographic projection of the first clock signal line on the base substrate at least partially overlaps an orthographic projection of one of the first gate driving circuit and the second gate driving circuit on the base substrate; the orthographic projection of the second clock signal line on the base substrate at least partially overlaps an orthographic projection of the other of the first gate driving circuit and the second gate driving circuit on the base substrate.

8. The display substrate according to claim 1, wherein the orthographic projection of the first level signal line on the base substrate is located between an orthographic projection of the first frame start signal line on the base substrate and an orthographic projection of the second frame start signal line on the base substrate.

9. The display substrate according to claim 1, wherein the orthographic projection of the first frame start signal line on the base substrate at least partially overlaps the orthographic projection of the first gate driving circuit on the base substrate;
    the orthographic projection of the second frame start signal line on the base substrate at least partially overlaps the orthographic projection of the second gate driving circuit on the base substrate.

10. The display substrate according to claim 1, wherein the orthographic projection of the first frame start signal line on the base substrate and the orthographic projection of the second frame start signal line on the base substrate are located between the orthographic projection of the first clock signal line on the base substrate and the orthographic projection of the second clock signal line on the base substrate.

11. The display substrate according to claim 1, wherein a width-to-length ratio of a channel of an output transistor included in the first gate driving circuit is equal to or greater than a width-to-length ratio of a channel of an output transistor included in the second gate driving circuit.

12. The display substrate according to claim 1, wherein the display substrate further includes a plurality of first sub-pixel driving circuits, a plurality of light emitting elements, a plurality of data lines, a plurality of second initialization signal lines and a plurality of third initialization signal lines, the first sub-pixel driving circuit includes a first driving transistor, a first data writing-in transistor, a first compensation transistor, a second reset transistor and a third reset transistor;
    a gate electrode of the first data writing-in transistor is coupled to an output terminal of a corresponding first gate driving circuit, and a first electrode of the first data writing-in transistor is coupled to a corresponding data line, and a second electrode of the first data writing-in transistor is coupled to a first electrode of the first driving transistor;

a gate electrode of the first compensation transistor is coupled to the output terminal of the corresponding first gate driving circuit, and a first electrode of the first compensation transistor is coupled to a second electrode of the first driving transistor, a second electrode of the first compensation transistor is coupled to a gate electrode of the first driving transistor;

a gate electrode of the second reset transistor is coupled to an output terminal of a corresponding second gate driving circuit, and a first electrode of the second reset transistor is coupled to a corresponding second initialization signal line, and a second electrode of the second reset transistor is coupled to a corresponding light emitting element;

a gate electrode of the third reset transistor is coupled to the output terminal of the corresponding second gate driving circuit, and a first electrode of the third reset transistor is coupled to a corresponding third initialization signal line, and a second electrode of the third reset transistor is coupled to the first electrode of the first driving transistor.

13. The display substrate according to claim 1, wherein the display substrate further includes a plurality of second sub-pixel driving circuits, a plurality of light emitting elements, a plurality of data lines and a plurality of second initialization signal lines, the second sub-pixel driving circuit includes a second driving transistor, a second data writing-in transistor, a second compensation transistor and a second reset transistor;

a gate electrode of the second data writing-in transistor is coupled to an output terminal of a corresponding second gate driving circuit, and a first electrode of the second data writing-in transistor is coupled to a corresponding data line, and a second electrode of the second data writing-in transistor is coupled to a first electrode of the second driving transistor;

a gate electrode of the second compensation transistor is coupled to an output terminal of a corresponding first gate driving circuit, and a first electrode of the second compensation transistor is connected to a second electrode of the second driving transistor, a second electrode of the second compensation transistor is coupled to a gate electrode of the second driving transistor;

a gate electrode of the second reset transistor is coupled to the output terminal of the corresponding second gate driving circuit, and a first electrode of the second reset transistor is coupled to a corresponding second initialization signal line, and a second electrode of the second reset transistor is coupled to a corresponding light emitting element.

14. The display substrate according to claim 1, wherein the display substrate further comprises:

a first electrostatic discharge circuit, the first electrostatic discharge circuit being coupled to the first gate driving circuit;

a second electrostatic discharge circuit, the second electrostatic discharge circuit being coupled to the second gate driving circuit;

wherein the first electrostatic discharge circuit and the second electrostatic discharge circuit are arranged symmetrically, and the first electrostatic discharge circuit and the second electrostatic discharge circuit share at least one signal line.

15. The display substrate according to claim 1, wherein the peripheral area further comprises:

a plurality of light emitting control driving circuits, wherein the plurality of light emitting control driving circuits are divided into a plurality of groups of light emitting control driving circuits, each group of light emitting control driving circuits include two light emitting control driving circuit that are arranged symmetrically, the two light emitting control driving circuits share at least one signal line.

16. A method of manufacturing the display substrate according to claim 1, comprising:

making the plurality of first gate driving circuits and the plurality of second gate driving circuits, the first gate driving signal output by the first gate driving circuit and the second gate driving signal output by the second gate driving circuit have different timing; the first gate driving circuit and the second gate driving circuit share at least one signal line.

* * * * *